(12) United States Patent
Akagi et al.

(10) Patent No.: US 7,911,023 B2
(45) Date of Patent: Mar. 22, 2011

(54) SEMICONDUCTOR APPARATUS INCLUDING A DOUBLE-SIDED ELECTRODE ELEMENT AND METHOD FOR MANUFACTURING THE SAME

(75) Inventors: Nozomu Akagi, Nukata-gun (JP); Hitoshi Yamaguchi, Nisshin (JP); Tetsuo Fujii, Toyohashi (JP)

(73) Assignee: Denso Corporation, Kariya (JP)

( * ) Notice: Subject to any disclaimer, the term of this patent is extended or adjusted under 35 U.S.C. 154(b) by 5 days.

(21) Appl. No.: 12/289,772

(22) Filed: Nov. 4, 2008

(65) Prior Publication Data

US 2009/0114985 A1 May 7, 2009

(30) Foreign Application Priority Data

Nov. 6, 2007 (JP) ................................. 2007-288894
Sep. 24, 2008 (JP) ................................. 2008-244841

(51) Int. Cl.
*H01L 21/70* (2006.01)
(52) U.S. Cl. ....................................... 257/511; 257/374
(58) Field of Classification Search .................. 257/511, 257/374
See application file for complete search history.

(56) References Cited

U.S. PATENT DOCUMENTS

| | | | |
|---|---|---|---|
| 5,442,223 A | 8/1995 | Fujii | |
| 5,753,529 A | 5/1998 | Chang et al. | |
| 6,140,690 A | 10/2000 | Oka et al. | |
| 6,787,874 B2 | 9/2004 | Ootera | |
| 7,235,857 B2 | 6/2007 | Majumdar et al. | |
| 2002/0031897 A1 | 3/2002 | Ueda et al. | |
| 2003/0153125 A1 | 8/2003 | Ueda et al. | |
| 2003/0197220 A1* | 10/2003 | Disney | 257/328 |
| 2004/0238844 A1* | 12/2004 | Tokano et al. | 257/197 |
| 2005/0167742 A1* | 8/2005 | Challa et al. | 257/328 |
| 2005/0199905 A1* | 9/2005 | Komachi | 257/141 |
| 2006/0108600 A1 | 5/2006 | Okumura et al. | |
| 2006/0172494 A1 | 8/2006 | Kohlmann-Von Platen et al. | |

FOREIGN PATENT DOCUMENTS

| | | |
|---|---|---|
| DE | 198-00-715 A1 | 7/1999 |
| JP | A-S64-084671 | 3/1989 |
| JP | A-H2-039565 | 2/1990 |
| JP | A-H2-262359 | 10/1990 |
| JP | A-07-161809 | 6/1995 |
| JP | A-2007-013003 | 1/2007 |
| JP | A-2007-116190 | 5/2007 |
| JP | A-2007-129086 | 5/2007 |
| JP | A-2007-157797 | 6/2007 |
| JP | A-2008-166705 | 7/2008 |

OTHER PUBLICATIONS

Notification of Reason for Refusal mailed May 6, 2010 from the Japan Patent Office for corresponding patent application No. 2008-244841 (English translation enclosed).

* cited by examiner

*Primary Examiner* — Thao X Le
*Assistant Examiner* — Geoffrey Ida
(74) *Attorney, Agent, or Firm* — Posz Law Group, PLC

(57) ABSTRACT

A semiconductor apparatus is disclosed. The semiconductor apparatus includes a semiconductor substrate that has a first surface and a second surface opposite to each other. The semiconductor apparatus further includes multiple double-sided electrode elements each having a pair of electrodes located respectively on the first and second surfaces of the semiconductor substrate. A current flows between the first and second electrode. Each double-sided electrode element has a PN column region located in the semiconductor substrate. The semiconductor apparatus further includes an insulation trench that surrounds each of multiple double-sided electrode elements, and that insulates and separates the multiple double-sided electrode elements from each other.

19 Claims, 14 Drawing Sheets

BVdss = 189.5V

BVdss = 139.8V

BVdss = 140.3V

SEMICONDUCTOR APPARATUS INCLUDING A DOUBLE-SIDED ELECTRODE ELEMENT AND METHOD FOR MANUFACTURING THE SAME

CROSS REFERENCE TO RELATED APPLICATION

The present application is based on Japanese Patent Application No. 2007-288894 filed on Nov. 6, 2007 and Japanese Patent Application No. 2008-244841 filed on Sep. 24, 2008, the disclosures of which are incorporated herein by reference.

BACKGROUND OF THE INVENTION

1. Field of the Invention

The present invention relates to a semiconductor apparatus having multiple double-sided electrode elements, which are located in a single semiconductor substrate, and relates to a method for manufacturing the same.

2. Description of Related Art

Some semiconductor apparatuses include a double-sided electrode element (e.g., vertical type MOS transistor element), which has a pair of electrodes respectively located on a front side and a back side of a semiconductor substrate, and which is configured so that a current flows between the pair of electrodes. It is known that a super junction (SJ) structure may improve such a double-sided electrode element in breakdown voltage and on-state resistance. The super junction structure includes, for example, a PN column region that functions as a drift region. The PN column region has multiple N type semiconductor parts and multiple P type semiconductor parts, which are adjacently and alternately arranged to each other.

JP-A-2007-13003 discloses a semiconductor apparatus that includes multiple double-sided electrode elements arranged in a semiconductor substrate having a PN column region. The above semiconductor apparatus includes an N channel MOS transistor element having N type semiconductor parts for a drift region and a P channel MOS transistor element having P type semiconductor parts for a drift region. The N channel MOS transistor element and the P channel MOS transistor element are arranged in the same semiconductor substrate.

In the semiconductor apparatus disclosed in JP-A-2007-13003, PN junction separation insulates and separates adjacent elements from each other (see FIGS. 2 and 14 in JP-A-2007-13003). The inventors however have found the following difficulties associated with improving a breakdown voltage of a double-sided electrode element. Due to the PN junction separation, it becomes difficult to decrease an area of an element separation region or narrow a width of the element separation region. It is thus difficult to downsize a semiconductor apparatus and difficult to decrease manufacturing cost of the semiconductor apparatus.

Further, a part of the PN column region serves as an element separation region of the PN junction separation. Hence, when a transient signal (e.g., noise, surge) is applied, charge balance in the PN column region may become abnormal, or in other words, a latch-up may take place in a PNPN structure. Due to the parasitic effect, a short-circuiting may take place around a source electrode.

SUMMARY OF THE INVENTION

In view of the above and other difficulties, it is an objective of the present invention to provide a semiconductor apparatus and a method for manufacturing a semiconductor apparatus.

According to a first aspect of the present invention, a semiconductor apparatus is provided. The semiconductor apparatus includes a semiconductor substrate that has a first surface and a second surface opposite to each other, and that has multiple element forming regions. The semiconductor apparatus further includes an insulation trench that surrounds each of the multiple element forming regions, and that insulates and separates the multiple element forming regions from each other. The semiconductor apparatus further includes multiple elements that is respectively located in the multiple element forming regions. The multiple elements include at least two double-sided electrode elements. Each double-sided electrode element includes a first electrode that is located on one of the first surface and the second surface of the semiconductor substrate. Each double-sided electrode element further includes a second electrode that is located on the other of the first surface and the second surface of the semiconductor substrate. Each double-sided electrode element is configured so that a current flows between the first electrode and the second electrode. Each double-sided electrode element further includes a PN column region that is located in the semiconductor substrate, and that includes multiple P conductivity type semiconductor parts and multiple N conductivity type semiconductor parts. The multiple P conductivity type semiconductor parts and the multiple N conductivity type semiconductor parts are alternately and adjacently arranged in a direction perpendicular to a thickness direction of the semiconductor substrate. Each double-sided electrode element further includes a drift region that is provided by one of the multiple P conductivity type semiconductor parts and the multiple N conductivity type semiconductor parts of the PN column region.

According to the above semiconductor apparatus, since the insulation trench can function as an element separation region, it is possible to downsize the semiconductor apparatus. Further, since the insulation trench can function as an element separation region, it is possible to restrict an occurrence of short-circuiting resulting from a parasitic effect.

According to a second aspect of the present invention, a method for manufacturing a semiconductor apparatus is provided. The method includes preparing a semiconductor substrate that has a first surface and a second surface opposite to each other. The semiconductor apparatus includes a PN column region having multiple P conductivity type semiconductor parts and multiple N conductivity type semiconductor parts. The multiple P conductivity type semiconductor parts and the multiple N conductivity type semiconductor parts are alternately and adjacently arranged to each other in a direction perpendicular to a thickness direction of the semiconductor substrate. The method further includes forming an insulation trench on the semiconductor substrate from a first surface side of the semiconductor substrate, so that the insulation trench has an open end on the first surface side and a bottom in the semiconductor substrate. The insulation trench defines multiple element forming regions. The insulation trench separates and insulates the multiple element forming regions from each other. The insulation trench is formed so that each element-forming region has the multiple P conductivity type semiconductor parts and the multiple N conductivity type semiconductor parts. The method further includes forming parts of a double-sided electrode element on the first surface side of each element-forming region of the semiconductor substrate. The parts of the double-sided electrode element include a first electrode. The method further includes: after the forming of the insulation trench, and after the forming of the parts of the double-sided electrode element on the first surface side, thinning the semiconductor substrate by removing a second surface potion of the semiconductor substrate, so that the insulation trench is exposed from a second surface side of the semiconductor substrate. The method further includes: after the thinning of the semiconductor substrate, forming other parts of the double-sided electrode element on the second surface side of each element forming region. The other parts include a second electrode opposed to the first electrode. The double-sided electrode element is formed so that a current flows between the first electrode and the second electrode.

According to the above method, it is possible to provide a semiconductor apparatus with a small size since the insulation trench can function as an element separation region. Further, it is possible to provide a semiconductor apparatus that can restrict an occurrence of short-circuiting resulting from a parasitic effect since the insulation trench can function as an element separation region.

According to a third aspect of the present invention, a method for manufacturing a semiconductor apparatus is provided. The method includes preparing a semiconductor substrate that includes a first surface and a second surface opposite to each other. The semiconductor substrate further includes a PN column region having multiple P conductivity type semiconductor parts and multiple N conductivity type semiconductor parts. The multiple P conductivity type semiconductor parts and the multiple N conductivity type semiconductor parts are alternately and adjacently arranged to each other in a direction perpendicular to a thickness direction of the semiconductor substrate. The semiconductor substrate has multiple element forming regions. The method further includes forming parts of a double-sided electrode element on a first surface side of each element-forming region of the semiconductor substrate. The parts of the double-sided electrode element include a first electrode. The method further includes forming a first surface side insulation film on the first surface side of the semiconductor substrate. The method further includes: after the forming of the parts of the double-sided electrode element on the first surface side, and after the forming of the first surface side insulation film, forming an insulation trench from a second surface side of the semiconductor substrate, so that the insulation trench reach the first surface side insulation film. The insulation trench separates and insulates the multiple element forming regions from each other. The insulation trench surrounds each of the multiple element forming regions. The insulation trench is formed so that each element forming region includes the multiple P conductivity type semiconductor parts and the multiple N conductivity type semiconductor parts. The method further includes: after the forming of the parts of the double-sided electrode element on the first surface side, forming other parts of the double-sided electrode element on the second surface side of each element forming region of the semiconductor substrate. The other parts include a second electrode opposed to the first electrode. The double-sided electrode element is formed so that a current flows between the first electrode and the second electrode.

According to the above method, it is possible to provide a semiconductor apparatus with a small size since the insulation trench can function as an element separation region. Further, it is possible to provide a semiconductor apparatus that can restrict an occurrence of short-circuiting resulting from a parasitic effect since the insulation trench can function as an element separation region.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary embodiments are described below with reference to the accompanying drawings. In the following embodiments, like parts or equivalent parts refer to like numeral references.

First Embodiment

Figure 1:
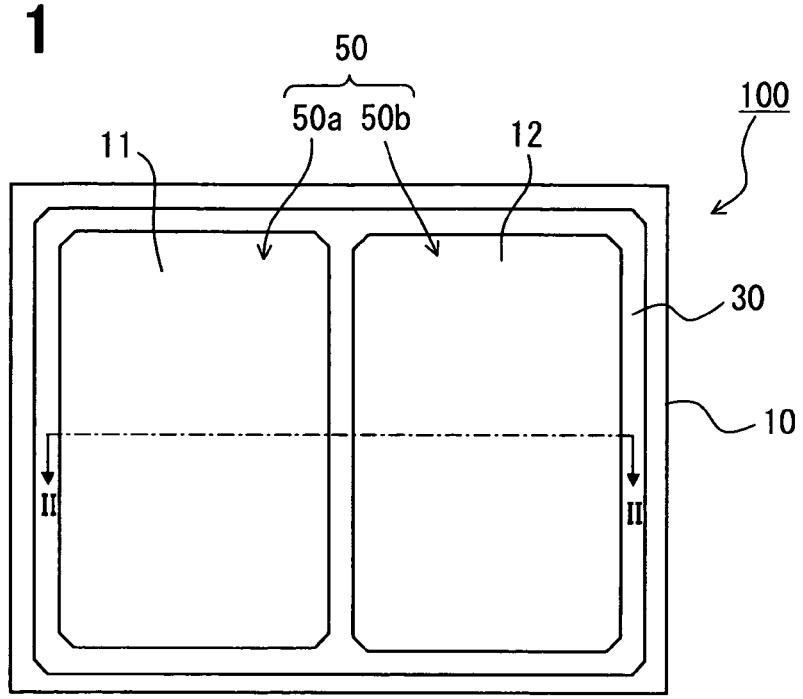
FIG. 1 is a plan view illustrating a semiconductor apparatus in accordance with a first embodiment.
Figure 2:
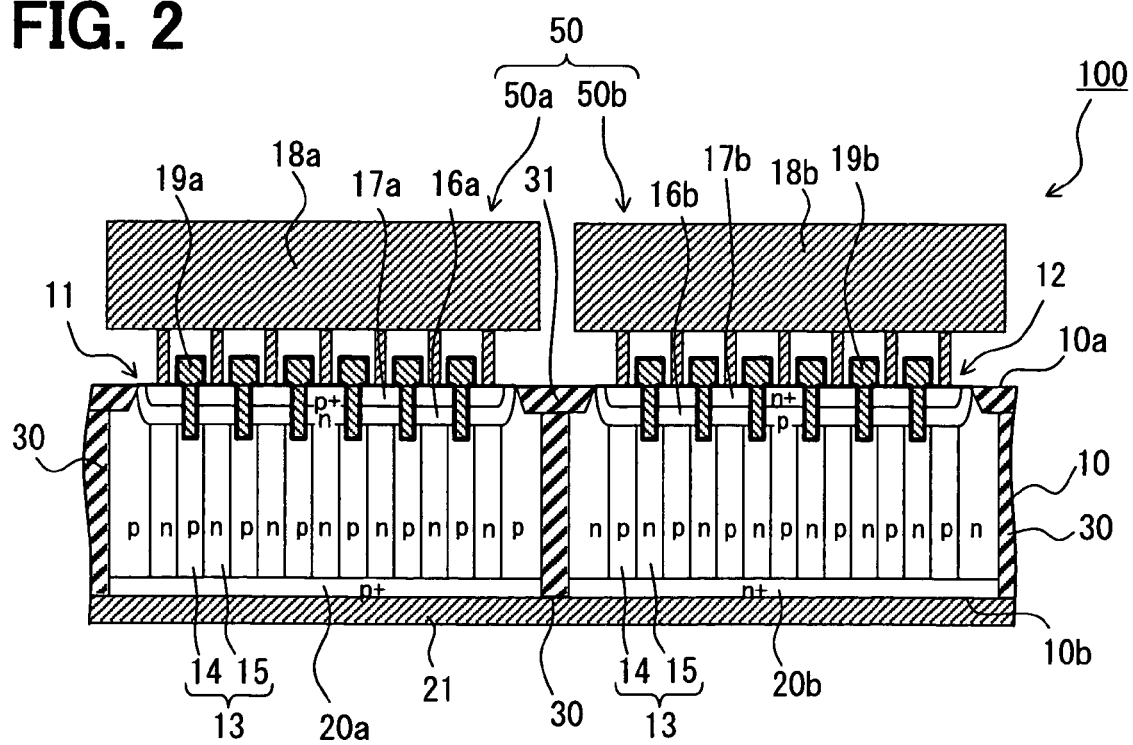
FIG. 2 is a cross sectional diagram taken along line II-II in FIG. 1.

A first embodiment is described below. FIG. 1 is a plan view illustrating a schematic configuration of a semiconductor apparatus in accordance with a first embodiment. For simplicity, FIG. 1 does not show some parts of an element, an interlayer insulation film, a protection film, and the like, which are formed in and on a semiconductor substrate. FIG. 2 is a cross sectional diagram taken along line II-II in FIG. 1. For simplicity, FIG. 1 does not show the interlayer insulation film, the protection film, and the like.

As shown in FIGS. 1 and 2, an insulation trench 30 is formed in a semiconductor substrate 10. The insulation trench 30 partitions an element forming region 11 and an element-forming region 12. A double-sided electrode element 50 is formed as an element in each of the element forming regions 11, 12. Herein, the double-sided electrode element 50 corresponds to, in a broad sense, an active element that has a pair of electrodes respectively located on a front surface 10a and a rear surface 10b of the semiconductor substrate 10, and that is configured so that a current flows between the pair of electrodes. The double-sided electrode element 50 corresponds to, in a more specific sense, an active element that has a drift region in a PN column layer 13, as described below. The double-sided electrode element 50 corresponds to, for example, a vertical type transistor element. In the present embodiment, a vertical type MOS transistor element is used as an example of the double-sided electrode element 50.

As shown in FIG. 2, the semiconductor substrate 10 includes a PN column region 13 in a region where the double-sided electrode element 50 is formed. The PN column region 13 includes multiple P conductivity type semiconductor parts 14 and multiple N conductivity type semiconductor parts 15. The multiple P conductivity type semiconductor parts 14 and the multiple N conductivity type semiconductor parts 15 are adjacently and alternately arranged in a direction substantially perpendicular to a thickness direction of the semiconductor substrate 10. The direction substantially perpendicular to the thickness direction of the semiconductor substrate 10 is also referred to herein as a lateral direction. The PN column region 13 may be formed by application of a trench filling method to a substrate made of bulk single crystal silicon having an N conductivity type, such as an N− conductivity type, so that the multiple P and N conductivity type semiconductor parts 14, 15 are arranged in a stripe pattern. Alternatively, the P conductivity type semiconductor parts 14 and the N conductivity type semiconductor parts 15 can have another configuration when the another configuration can provide the followings: the P or N conductivity type semiconductor parts 14, 15 function as a drift region when the double-sided electrode element 50 is in an on-state; when the double-sided electrode element 50 is in an off-state, a depletion layer extends from each PN junction of the PN column region 13 in a lateral direction to fully deplete the PN column region 13; and a desired breakdown voltage is ensured.

The PN column region 13 in an element-forming region 11 is separated or spaced away from that in another element forming region 12 by the insulation trench 30 that is formed in the semiconductor substrate 10. Each of the element forming regions 11, 12 individually has the PN column region 13, which functions as a drift region of the double-sided electrode element 50 (i.e., 50a, 50b) for the corresponding element-forming region 11, 12.

In the element-forming region 11, a base region 16a is formed so as to directly contact the PN column region 13 on a front surface 10a side of the semiconductor substrate 10. The base region 16a is a channel formation region and has an N conductivity type. A source region 17a is selectively formed in a surface portion of the base region 16a. The source region 17a has a P conductivity type, such as a P+ conductivity type. The source region 17a is electrically connected with a source electrode 18a. The source electrode 18a is the first electrode of the double-sided electrode element 50a. A gate electrode 19a has a trench structure. The gate electrode 19a is configured so as to penetrate the source region 17a and the base region 16a. An end portion of the gate electrode 19a projects into the P conductivity type semiconductor part 14. The gate electrode 19a has multiple parts arranged in a stripe pattern. The multiple parts, each of which has a generally straight shape, are arranged substantially parallel to each other. The stripe pattern of the gate electrode 19b is substantially parallel to that of the PN column region 13. The gate electrode 19a is covered with a gate insulation film. The source electrode 18a and the gate electrode 19a is electrically insulated from each other by an interlayer insulation film (not shown). A drain region 20a is formed so as to directly contact the PN column region 13 on a rear surface 10b side of the semiconductor substrate 10. The drain region 20a has the P conductivity type, such as the P+ conductivity type. The drain region 20a is electrically connected with the drain electrode 21. The drain electrode 21 is the second electrode of the double-sided electrode element 50a.

As one type of the double-sided electrode element 50, a P channel type double-sided electrode element 50a is configured in the element-forming region 11 of the semiconductor substrate 10. The P channel type double-sided electrode element 50a uses the P conductivity type semiconductor parts 14 of the PN column region 13 as the drift region. More specifically, a P channel type vertical MOS transistor element is configured in the element-forming region 11 has.

In the element forming region 12, a base region 16b having the P conductivity type is formed so as to directly contact the PN column region 13 on the front surface 10a side of the semiconductor substrate 10. The base region 16b functions as a channel formation region. The source region 17b is selectively formed in a surface portion of the base region 16b. The source region 17b has the N conductivity type, such as the N+ conductivity type. The source region 17b is electrically connected with the source electrode 18b. The source electrode 18b is the first electrode of the double-sided electrode element 50b. A gate electrode 19b has a trench structure. The gate electrode 19b is formed so as to penetrate the source region 17b and the base region 16b. An end portion of the gate electrode 19b projects into the N conductivity type semiconductor part 15. The gate electrode 19b has multiple parts arranged in a stripe pattern. The multiple parts, each of which has a generally straight shape, are arranged substantially parallel to each other. The stripe pattern of the gate electrode 19b is substantially parallel to that of the PN column region 13. The gate electrode 19b is covered with a gate insulation film. The source electrode 18b and the gate electrode 19b are electrically insulated from each other by an interlayer insulation film (not shown). A drain region 20b is formed so as to directly contact the PN column region 13 on the rear surface 10b side of the semiconductor substrate 10. The drain region 20b has the N conductivity type, such as the N+ conductivity type. The drain region 20b is electrically connected with the drain electrode 21. The drain electrode 21 is a common element between the drain region 20a and the drain region 20b. The above configuration having the shared or common drain electrode 21 can be achieved when drain potentials of the elements 50a, 50b are the same. In the present embodiment, the drain electrode 21 is uniformly disposed on the whole of the rear surface 10b of the semiconductor substrate 10.

As another type of the double-sided electrode element 50, an N channel type the double-sided electrode element 50b is configured in the element forming region 12 of the semiconductor substrate 10. The N channel type double-sided electrode element 50b uses the N conductivity type semiconductor parts 15 of the PN column region 13 as a drift region. More specifically, an N channel type vertical MOS transistor element is configured in the element forming region 12.

As shown in FIGS. 1 and 2, the insulation trench 30 is formed so as to surround each of the element forming regions 11 and 12. The insulation trench 30 insulates and separates the element forming regions 11 and 12 from each other. In the present embodiment, the insulation trench 30 is such that a trench is filled with an insulator (e.g., an dielectric). The insulation trench 30 penetrates the semiconductor substrate 10 from the front surface 10a to the rear surface 10b. An end portion of the insulation trench 30 on the front surface 10a side is in contact with a local oxidation of silicon (LOCOS) film 31. Another end portion of the insulation trench 30 on the rear surface 10b side is in contact with the drain electrode 21. The above-configured insulation trench 30 singly surrounds each of the element forming regions 11, 12, and the single insulation trench 30 is located between the element forming regions 11 and 12.

According to one example of the semiconductor apparatus 100 of the present embodiment, the element forming regions 11 and 12 for the double-sided electrode elements 50 (i.e., 50a and 50b) respectively have the PN column regions 13 for the drift regions of the double-sided electrode elements 50 (i.e., 50a and 50b). Since the PN column region 13 provides the drift region through the above manners, each of the multiple double-sided electrode elements 50a, 50b arranged in a single semiconductor substrate 10 can have a high breakdown voltage and a low on-state resistance.

Further, the element forming regions 11 and 12 for respective double-sided electrode elements 50a, 50b are insulated and separated from each other by the insulation trench 30 that surrounds each of the element forming regions 11, 12. Since the insulation separation trench 30 is adopted as an element separation region, it is possible to narrow a width of the element separation region and decrease an area of the element separation region with a breakdown voltage kept constant. Consequently, it is possible to decrease a size of the semiconductor apparatus 100. Further, with a size of the semiconductor apparatus 100 kept constant, it is possible to provide a semiconductor apparatus 100 with high integration more than a case of the PN junction separation. Further, it is possible to provide a semiconductor apparatus 100 with a high breakdown voltage, with the width or the area of the element separation region kept constant. This is because a potential barrier of the insulation trench 30 is larger than that of the PN junction separation.

In the related art, a PN junction separation is used as an element separation region. Application of a transient signal can cause charge balance in the PN column region to be abnormal, or in other words, causes a latch-up to take place in a PNPN structure. Due to the above parasitic effect, short-circuiting may take place around a source electrode 18a or 18b. The transient signal is for example a surge, noise, an unwanted part of an AC signal such as dv/dt surge, or the like.

In the present embodiment, on the other hand, the insulation trench 30 is used as an element separation region. Therefore, even when such a transient signal (e.g., surge) is applied, the short-circuiting due to a parasitic effect takes place less likely than when the PN junction separation is used as an element separation region. Accordingly, the semiconductor apparatus 100 according to the present embodiment can have a configuration that restricts an occurrence of short-circuiting due to the transient signal while the semiconductor apparatus 100 is being provided with a smaller size. The configuration includes the multiple double-sided electrode elements 50a, 50b having the PN column region 13.

Further, each of the element forming regions 11, 12 individually has the PN column region 13. Therefore, as illustrated in the above, it is possible to integrate the P channel type double-sided electrode element 50a and the N channel type double-sided electrode element 50b into the same semiconductor substrate 10.

Figure 3:
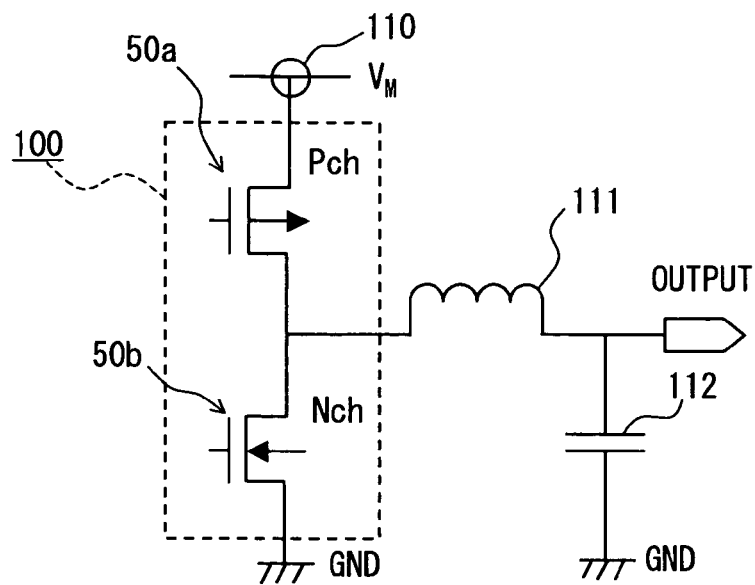
FIG. 3 is a circuit diagram illustrating a synchronous rectification type switching circuit including a semiconductor apparatus.

Further, the source electrodes 18a, 18b are respectively the first electrodes of the multiple double-sided electrode elements 50a, 50b, and are located on the front surface 10a side of the semiconductor substrate 10. The drain electrode 21 is the second electrode of the multiple double-sided electrode elements 50a, 50b, and is located on the rear surface 10b side of the semiconductor substrate 10. Therefore, it is possible to simplify the configuration and manufacturing processes of the semiconductor apparatus 100 when all of the first electrodes are placed on one of the front surface 10a side and the rear surface 10b side, and when the second electrode is placed on the other of the front surface 10a side and the rear surface 10b side, The semiconductor apparatus 100 having the above configuration is applicable to a synchronous rectification type switching circuit such as, for example, that shown in FIG. 3. FIG. 3 is a diagram illustrating one example of synchronous rectification type switching circuits to which the semiconductor apparatus according to the present embodiment is applied. The switching circuit (i.e., step-down circuit) shown in FIG. 3 includes a P channel MOS transistor element on a high-side and a N channel MOS transistor element on a low-side. In the switching circuit, the drain electrode for the both elements is set to the same electric potential. In the switching circuit, the MOS transistor elements on the high-side and the low-side are integrated into the same semiconductor substrate 10 of the semiconductor apparatus 100. More specifically, the above-described P channel type double-sided electrode element 50a is used as a MOS transistor located on the high-side (i.e., a high potential side or positive side of a direct power supply). The MOS transistor located on the high-side functions as a primary switching element. The N channel type double-sided electrode element 50b is used as a MOS transistor located on the low-side (i.e., a low potential side or negative side of the direct power supply). The MOS transistor located on the low-side functions as an element for synchronous rectification. The switching circuit further includes an inductance 111 and a smoothing capacitor 112.

Figure 4:
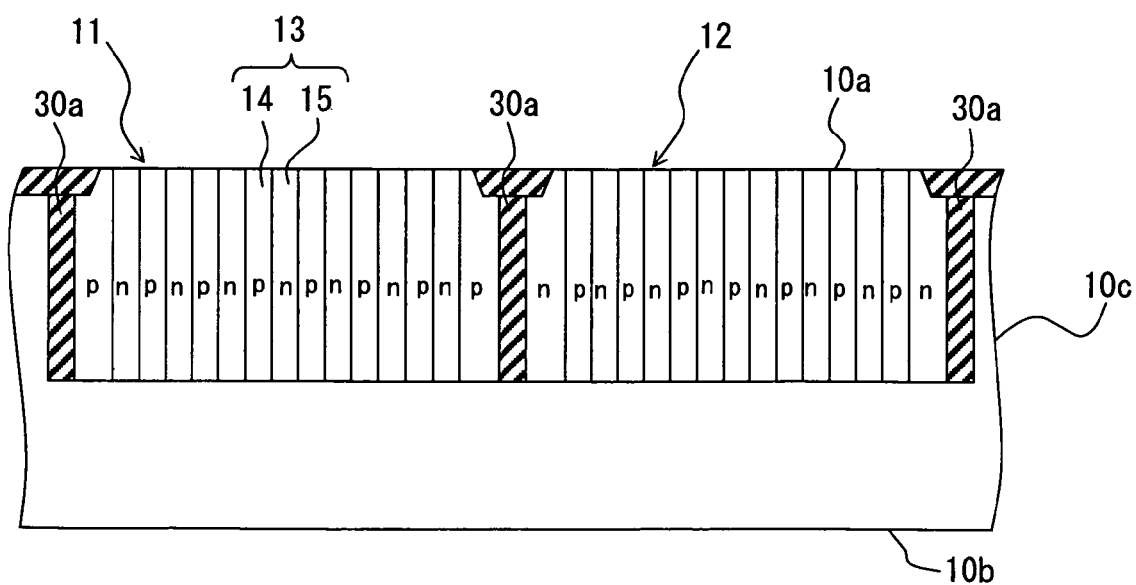
FIG. 4 is a cross sectional diagram illustrating a process of forming an insulation trench and processes performed before the forming of the insulation trench.
Figure 5:
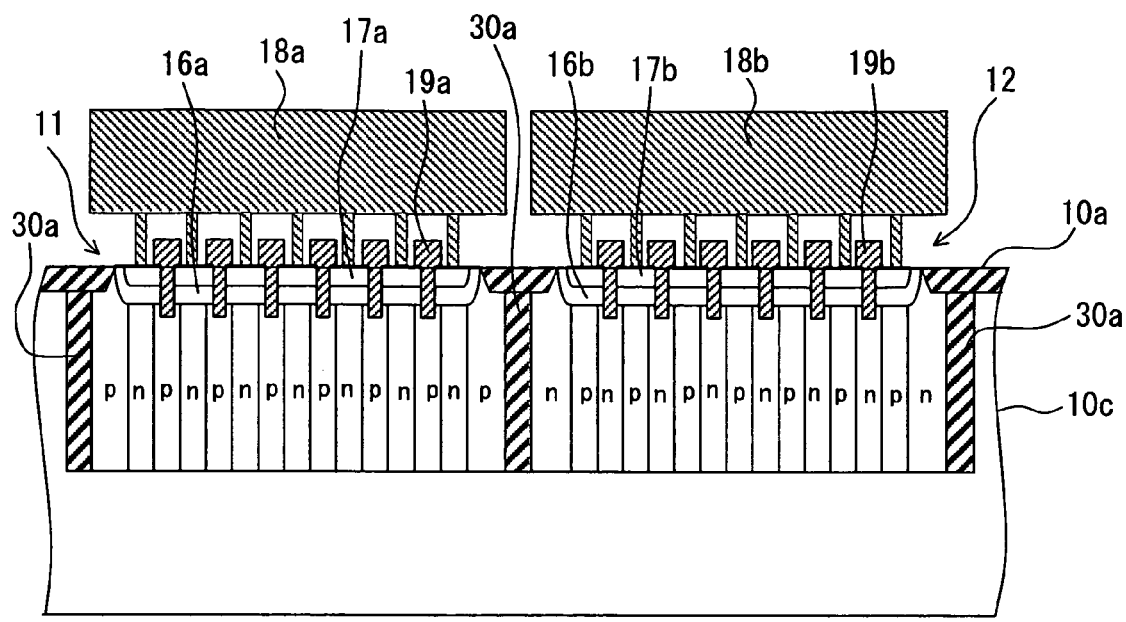
FIG. 5 is a cross sectional diagram illustrating a process of forming parts of a double-sided electrode element on a front surface side.
Figure 6:
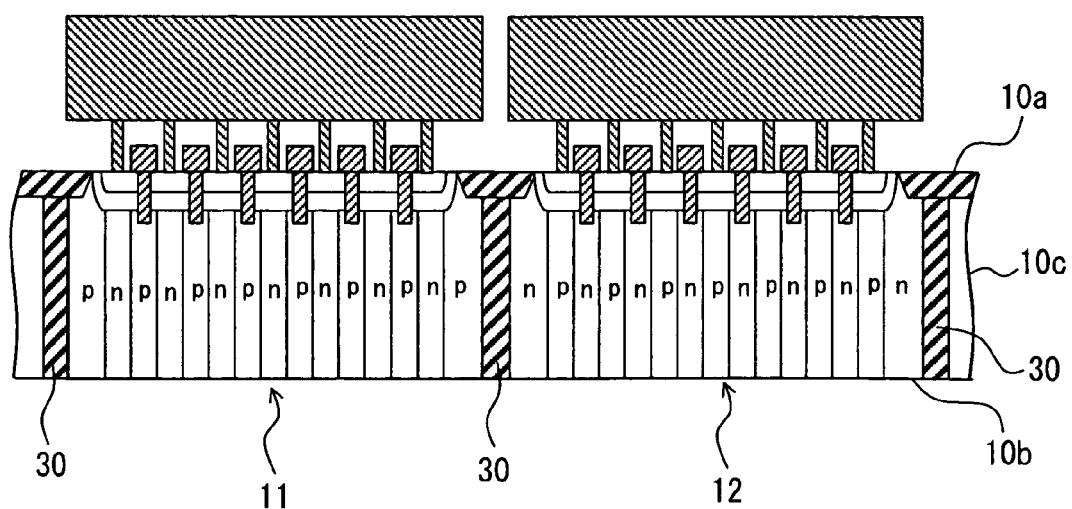
FIG. 6 is a cross sectional diagram illustrating a process of thinning a semiconductor substrate.
Figure 7:
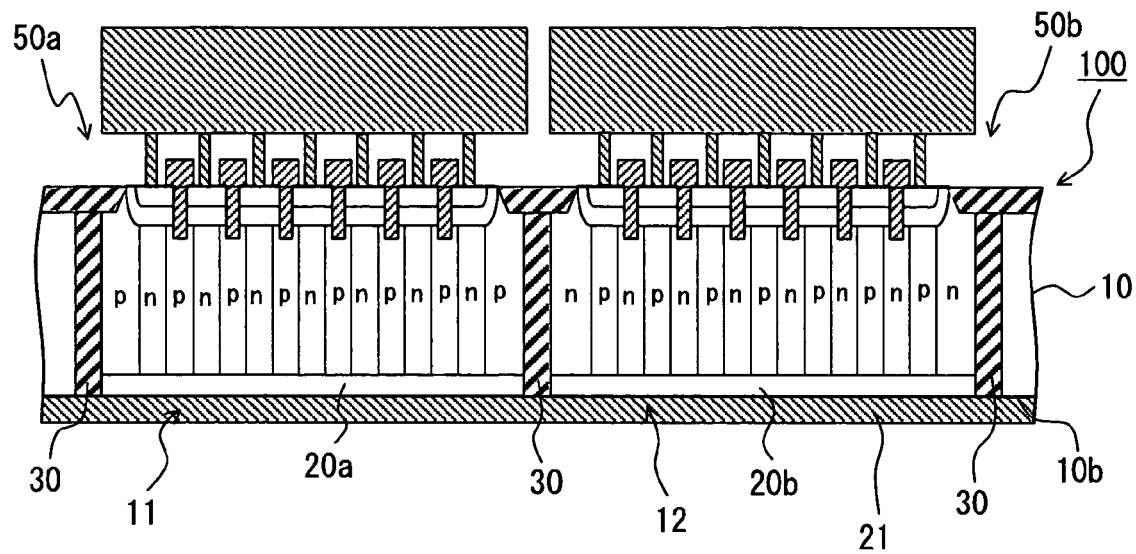
FIG. 7 is a cross sectional diagram illustrating a process of forming parts of a double-sided electrode element on a rear surface side.

An example method for manufacturing the semiconductor apparatus 100 is described below with reference to FIGS. 4 to 7 in accordance with the present embodiment. FIG. 4 is a cross sectional diagram associated illustrating a process of forming an insulation trench and processes performed in advance of the forming of the insulation trench. FIG. 5 is a cross sectional diagram illustrating a process of forming parts of the double-sided electrode element, the parts being located on a front surface side of a semiconductor substrate. FIG. 6 is a cross sectional diagram illustrating a process of thinning the semiconductor substrate. FIG. 7 is a cross sectional diagram illustrating other parts of the double-sided electrode element on a rear surface side of the semiconductor substrate.

A semiconductor substrate 10c (i.e., a wafer) having PN column region 13 is prepared. The semiconductor substrate 10c is obtained through application of, for example, a trench filling method or a multistage epitaxial growth method. For example, in the present embodiment, a single crystal bulk silicon substrate having an N conductivity type, such as N– conductivity type, is prepared. Multiple trenches are formed. Then, the trenches are filled with epitaxial layers having a conductivity type (e.g., P conductivity type) opposite to that of the semiconductor substrate 10c. Thereby, as shown in FIG. 4, a PN column region 13 is formed that includes P conductivity type semiconductor parts 14 and N conductivity type semiconductor parts 15 which are alternately and adjacently arranged to each other.

After the forming of the PN column region 13, an trench having a predetermined depth is formed on the semiconductor substrate 10c from the front surface 10a side by, for example, anisotropic dry etching so that the trench does not reach the rear surface 10b of the semiconductor substrate 10c and so that the insulation trench surrounds each of the element forming regions 11, 12, as shown in FIG. 4. The trench is filled with an insulator (e.g., a silicon oxide) by thermal oxidation, chemical vapor deposition, or the like, thereby to form the insulation trench 30a. The front surface 10a of the semiconductor substrate 10c corresponds to that of the semiconductor substrate 10 that is provided after wafer-dicing. It should be note that, as shown in FIG. 4, the insulation trench 30a is in a not-complete penetrating state, that is, the insulation trench 30a has a bottom inside the semiconductor substrate 10c and does not fully penetrate the semiconductor substrate 10c. In the present embodiment, the depth of the insulation trench 30a is substantially equal to that of the PN column region 13. Because of the same depth, in the below-described process where the semiconductor substrate 10c is thinned, it becomes possible to expose both an end of the insulation trench 30a and an end of the PN column region 13, which ends are located on the rear surface 10b side.

Then, as shown in FIG. 5, parts of each double-sided electrode element 50a, 50b on the front surface 10a side of the semiconductor substrate 10c are formed in corresponding element forming region 11, 12. More specifically, in the present embodiment, parts of the P channel type double-sided electrode element 50a and parts of the N channel type double-sided electrode element 50b are formed form the front surface 10a side of the semiconductor substrate 10c by known methods. The parts to be formed includes the base regions 16a and 16b, the source regions 17a and 17b, the source electrodes 18a and 18b, the gate electrodes 19a and 19b, the line (not shown), the interlayer insulation film (not shown), and the protection film (not shown).

Then, as shown in FIG. 6, the semiconductor substrate 10c is thinned in such a manner that a rear surface portion of the semiconductor substrate 10c is removed until the end of the insulation trench 30a on the rear surface 10b side is exposed. A method of removing the rear surface portion of the semiconductor substrate 10c is, for example, mechanical polishing (e.g., chemical mechanical polishing) or etching. In the present embodiment, for example, the mechanical polishing is performed, and then, a polished surface is wet-etched to remove a damaged layer originating form the polishing. Thereby, a thickness of the semiconductor substrate 10c with a wafer form becomes almost equal to that of the semiconductor substrate 10 that is provided after wafer dicing. Further, due to the thinning, the insulation trench 30a in the not-complete penetration state becomes one that penetrates the semiconductor substrate 10c form the front surface 10a to the rear surface 10b, and that insulates and separates the element forming regions 11 and 12 from each other. Further, the PN column region 13 is exposed from the rear surface 10b of the semiconductor substrate 10c.

Alternatively, the semiconductor substrate 10c may be thinned only by etching. In such a case, due to a difference in etching rate, the insulator (e.g., silicon oxide) in the insulation trench projects from the rear surface 10b. A projecting portion of the insulator may have a columnar shape. In such a case, the portion of the insulator having a columnar shape may be removed by, for example, a HF treatment after the etching.

After the thinning of the semiconductor substrate 10c, impurities are implanted into the semiconductor substrate 10c from the rear surface 10b side by, for example, ion implantation. Thereby, the drain regions 20a, 20b of P channel type and N channel type double-sided electrode elements 50a, 50b are respectively formed, as shown in FIG. 7. Then, a common drain electrode 21, a line (not shown), an interlayer insulation film (not shown), a protection film (not shown) and the like are formed. Then, the semiconductor substrate 10c is diced into the semiconductor substrate 10, and a semiconductor apparatus 100 is provided.

According to the above example method of the present embodiment, the insulation trench 30a in the not-complete penetration state is formed, and then, the parts of the double-sided electrode element 50a, 50b on the front surface 10a side of the semiconductor substrate 10c is formed. Alternatively, of the parts of the double-sided electrode element 50a, 50b on the front surface 10a side of the semiconductor substrate 10c, specific parts to be located in the semiconductor substrate 10c may be firstly formed. The specific parts include the base regions 16a, 16b and the source region 17a, 17b. Then, the rest parts (e.g., source electrode 18a, 18b) of the double-sided electrode element 50a, 50b on the front surface 10a side may be formed. Also, the elements to be located on the front surface 10a of the semiconductor substrate may be formed. The elements to be located on the front surface 10a include the line, the interlayer insulation film and the protection film.

Figure 8:
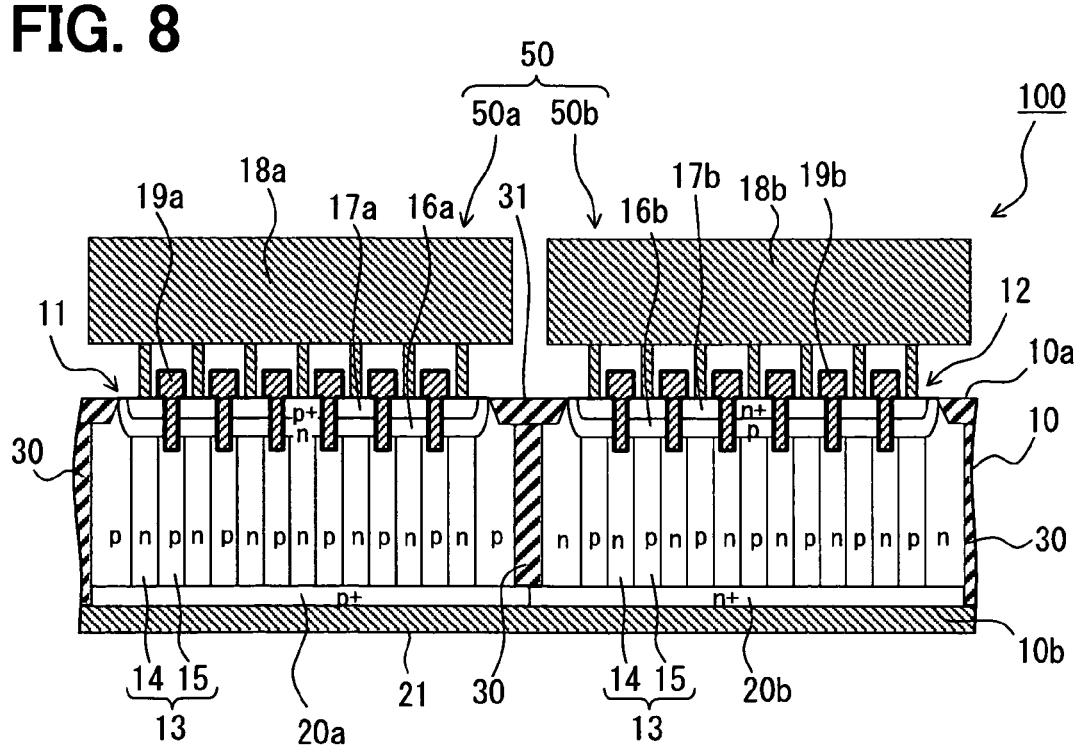
FIG. 8 is a cross sectional diagram illustrating a semiconductor apparatus in accordance with a modification example of the first embodiment.

According to the above example configuration of the first embodiment, the insulation trench 30 penetrates the semiconductor substrate 10 from the front surface 10a to the rear surface 10b. Further, the multiple double-sided electrode elements 50a, 50b have the common drain electrode 21, in other words, the multiple double-sided electrode elements 50a, 50b provide a single output circuit. The drain regions 20a, 20b thus have an almost same electric potential. Alternatively, the semiconductor apparatus having the common drain electrode 21 may be configured as follows. As shown in FIG. 8, the insulation trench 30 that insulates and separates the multiple double-sided electrode elements 50a, 50b from each other may extend from the front surface 10a of the semiconductor substrate 10 to an end portion of the PN column region 13, the end portion being located on the rear surface 10b side. In the above alternative case, since it is possible to decrease a depth of the insulation trench 30, the manufacturing becomes easier. FIG. 8 is a cross sectional diagram illustrating a semiconductor apparatus in accordance with a first modification of the first embodiment. FIG. 8 corresponds to FIG. 2.

Figure 9:
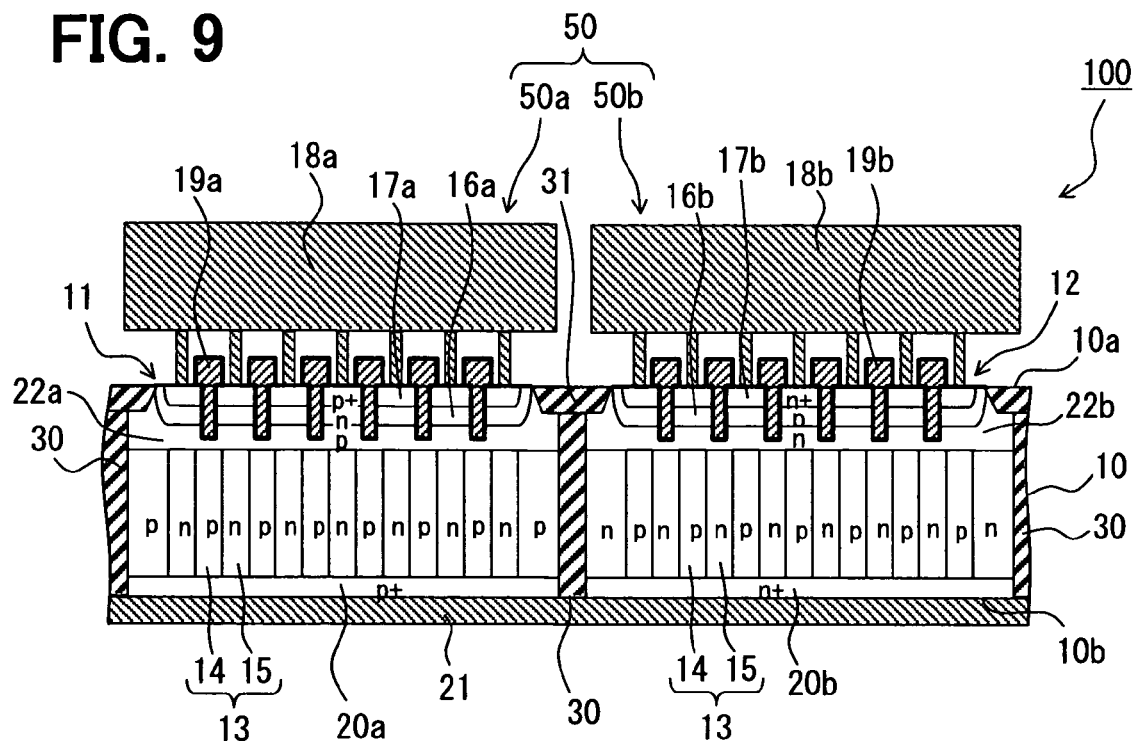
FIG. 9 is a cross sectional diagram illustrating a semiconductor apparatus in accordance with another modification example of the first embodiment.

According to the above example configuration of the first embodiment, the base regions 16a, 16b are located so as to directly contact end portions of the PN column region 13 on a front surface 10a side. Alternatively, in each element forming region 11, 12, as shown in FIG. 9, a buffer layer 22a, 22b having conductivity type identical to the channel may be respectively disposed between the end portion of the PN column region 13 on the front surface 10a side and the base region 16a, 16b. More specifically, in the P channel type double-sided electrode element 50a, the buffer layer 22a having the P conductivity type may be disposed between the end portion of the PN column region 13 on the front surface 10a side and the base region 16a. In the N channel type double-sided electrode element 50b, the buffer layer 22b having the N conductivity type may be disposed between the end portion of the PN column region 13 on the front surface 10a side and the base regions 16b. Further, impurity concentrations of the buffer layers 22a, 22b may be greater than or equal to that of the P conductivity type semiconductor part 14 and that of the N conductivity type semiconductor part 15, and less than or equal to those of the source regions 17a, 17b. In the above alternative configuration, current transmission paths become large between the source electrodes 18a, 18b and the drain electrode 21. As a result, it is possible to improve current transfer efficiency. That is, it is possible to reduce an on-state resistance of the double-sided electrode elements 50a, 50b. FIG. 9 is a cross sectional diagram illustrating a semiconductor apparatus according to a second modification of the first embodiment and corresponds to FIG. 2.

Figure 10A:
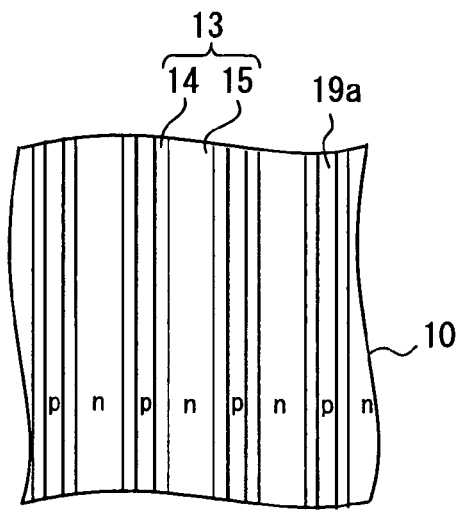
FIG. 10A is a diagram illustrating gate electrode arrangement relative to a PN column region in accordance with the first embodiment.
Figure 10B:
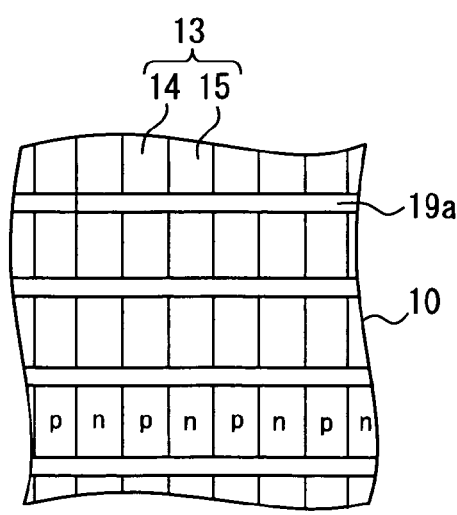
FIG. 10B is a diagram illustrating another gate electrode arrangement relative to the PN column region in accordance with the first embodiment.

According to one example configuration of the present embodiment, as shown in FIG. 10A, the stripe pattern of the gate electrode 19a, 19b is substantially parallel to that of the PN column region 13. FIG. 10A is a diagram illustrating an arrangement of the PN column region 13 relative to the gate electrode 19a. The above configuration minimizes a current path relative to the PN column, and a maximum current may be ensured. Alternatively, the stripe pattern of each gate electrode 19a, 19b may be unparallel to that of the PN column region 13. For example, as shown in FIG. 10B, the stripe pattern of each gate electrode 19a may be substantially perpendicular to that of the PN column region 13. The above alternative configuration does not require high-precision alignment of the gate electrodes 19a, 19b relative to the PN column region 13. It is thus possible to decrease a manufacturing cost of the semiconductor apparatus 100. FIG. 10A is a diagram schematically illustrating one example arrangement of the gate electrode relative to the PN column region in accordance with the present embodiment. FIG. 10B is a diagram schematically illustrating another example arrangement of the gate electrode relative to the PN column region in accordance with the present embodiment.

According to the example configuration of the present embodiment, the PN column region 13 is configured such that the multiple P conductivity type semiconductor parts 14 and the multiple N conductivity type semiconductor parts 15 are alternately arranged in a direction parallel to the front surface 10a of the semiconductor substrate and are arranged in a stripe pattern. Alternatively, for example, the PN column region may be configured such that multiple N conductivity type semiconductor parts 15 each having a polygonal shape, circular shape or the like are periodically arranged in a P conductivity type semiconductor part 14. Alternatively, the PN column region may be configured such that multiple P conductivity type semiconductor parts 14 each having a polygonal shape, circular shape or the like are periodically arranged in an N conductivity type semiconductor part 15. Such a configuration is disclosed in JP-A-2007-13003 by the inventor.

Second Embodiment

Figure 11:
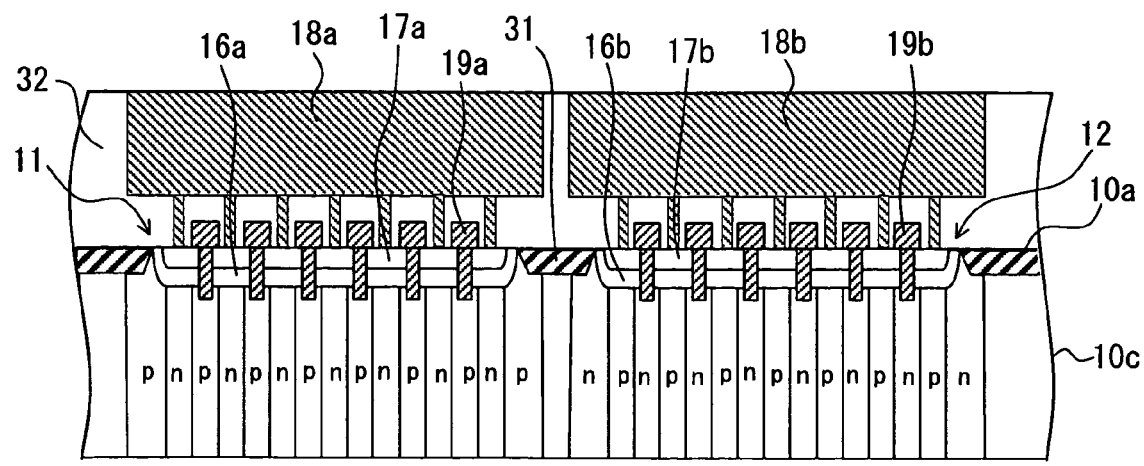
FIG. 11 is a cross sectional diagram illustrating a process of forming parts of a double-sided electrode element on a front surface side of a semiconductor substrate and illustrating processes performed before the forming of the part in accordance with a second embodiment.
Figure 12:
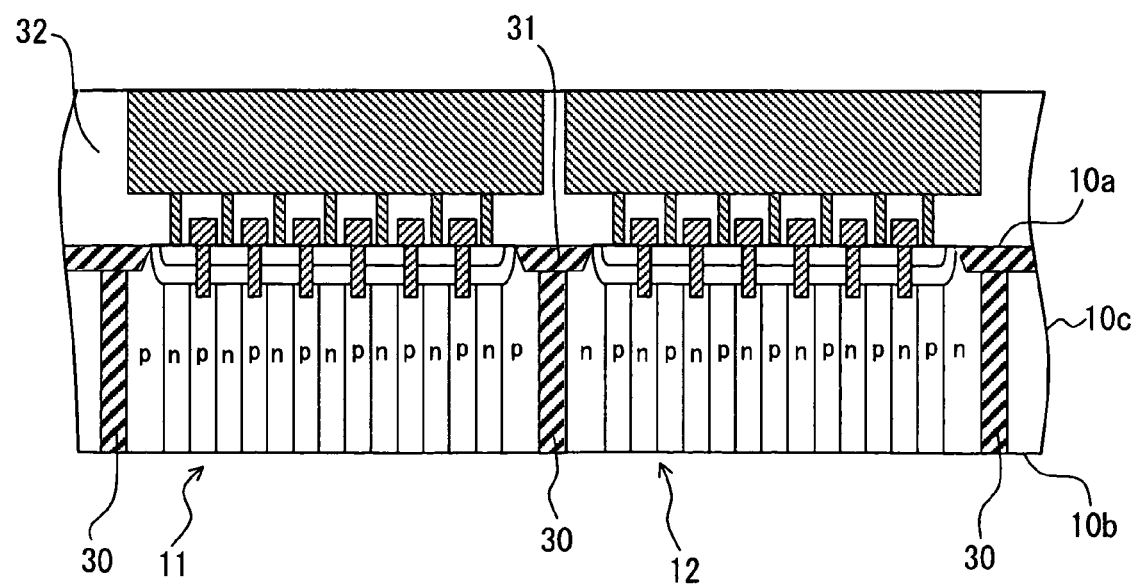
FIG. 12 is a cross sectional diagram illustrating a process of forming an insulation trench.
Figure 13:
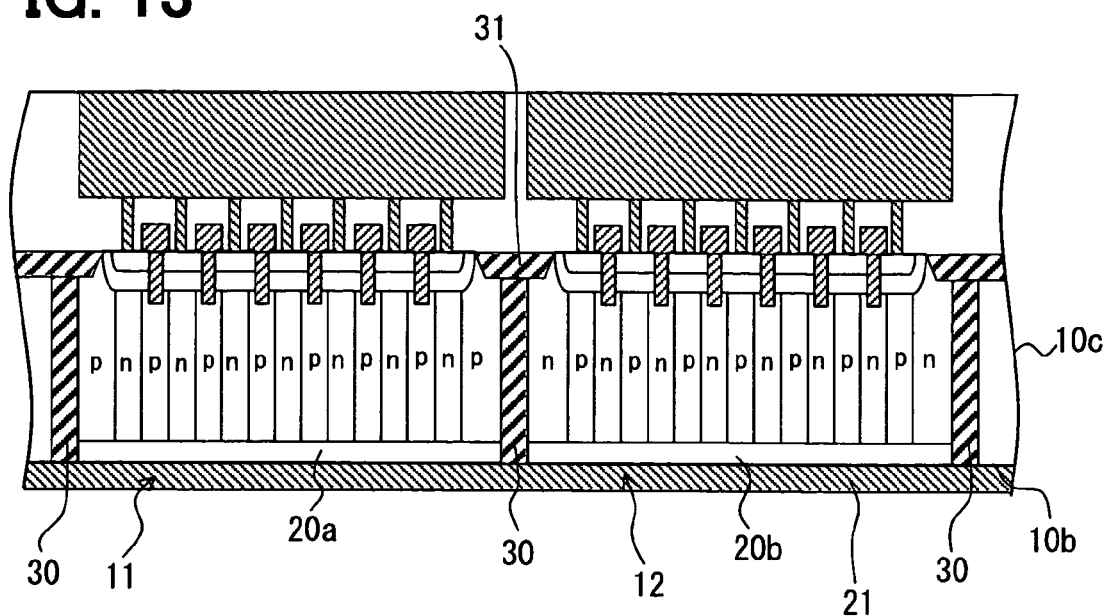
FIG. 13 is a cross sectional diagram illustrating a process of forming parts of a double-sided electrode element on a rear surface side of a semiconductor substrate.

A second embodiment is described below with reference to FIGS. 11 to 13. FIG. 11 is a cross sectional diagram illustrating a process of forming parts of a double-sided electrode element on a front surface side and associated with processes performed before the forming of the parts of the double-sided electrode element on the front surface side. FIG. 12 is a cross sectional diagram illustrating a process of forming an insulation trench. FIG. 13 is a cross sectional diagram illustrating a process of forming parts of a double-sided electrode element on a rear surface side.

According to one example manufacturing method of the first embodiment, an insulating trench in the not-complete penetrating state is formed. Then, the semiconductor substrate 10c is thinned by removal of the rear surface portion of the semiconductor substrate 10c, so that the insulation trench 30 penetrates the semiconductor substrate 10c from the front surface 10a to the rear surface 10b. The insulation trench 30 separates and insulates the element forming regions 11 and 12 from each other. In the method according to the present embodiment, parts of the double-sided electrode element 50a, 50b on the front surface 10a side is formed. Also, an insulation film (i.e., a front surface side insulation film) is formed on the front surface 10a. Then, by using the insulation film as a stopper, an insulation trench is formed in the semiconductor substrate 10 from the rear surface 10b side.

For example, an inter-layer insulation film (e.g., BPSG film) can be used as the insulation film that functions as a stopper in the formation of the insulation trench 30. Alternatively, a LOCOS or STI oxide film formed on a surface potion of the front surface 10a of the semiconductor substrate 10 may be used as the insulation film. Of the above insulation films, the LOCOS oxide film can provide high selectivity between the semiconductor substrate and the LOCOS oxide film, and the STI oxide film can also provide high selectivity between the semiconductor substrate and the STI oxide film.

A method for manufacturing a semiconductor apparatus 100 is more specifically described below in accordance with the present embodiment. A basic configuration of the semiconductor apparatus 100 manufactured by the method according to the present embodiment is substantially identical to that according to the first embodiment. As shown in FIG. 11, a semiconductor substrate 10c (i.e., wafer) having a PN column region 13 is prepared. Parts of each double-sided electrode element 50a, 50b on a front surface 10a side of the semiconductor substrate 10c are formed in corresponding element forming region 11, 12 that has multiple P and N conductivity type semiconductor parts 14, 15 in the PN column region 13. More specifically, parts of a P channel type double-sided electrode element and parts an N channel type double-sided electrode element 50b are formed from the front surface 10a side of the semiconductor substrate 10c. The parts formed includes the base regions 16a and 16b, the source regions 17a and 17b, the source electrodes 18a and 18b, the gate electrodes 19a and 19b, the line (not shown), the LOCOS oxide film 31, the interlayer insulation film (not shown), and the protection film (not shown).

Then, the semiconductor substrate 10c is thinned from the rear surface 10b side. Thereby, as shown in FIG. 11, the PN column region 13 is also exposed from the rear surface 10b of the semiconductor substrate 10c. The thinning is performed by, for example, mechanical polishing (e.g., chemical mechanical polishing), etching, or the like.

Then, as shown in FIG. 12, by using the LOCOS oxide film 31 as a stopper, a trench is formed on the semiconductor substrate 10c from the rear surface 10b side by anisotropic dry etching, so that the formed trench reaches the LOCOS oxide film 31 and so that the formed trench surrounds the element forming regions 11, 12. The insulation trench 30 is formed by filling the trench with an insulator (e.g., silicon oxide). Accordingly, the element forming regions 11 and 12 are separated and insulated from each other.

After the formation of the insulation trench 30, the drain regions 20a, 20b of respective P channel and N channel double-sided electrode elements 50a, 50b are formed, as shown in FIG. 13, by ion implantation in such a manner that impurities are implanted into the semiconductor substrate 10c from the rear surface 10b side. Then, a common drain electrode 21, a line (not shown), an interlayer insulation film (not shown), a protection film (not shown) and the like are formed. Then, the semiconductor substrate 10c is diced into the semiconductor substrate 10, thereby to provide a semiconductor apparatus 100.

The method through the above manners according to the present embodiment can provide the semiconductor apparatus 100.

According to one example manufacturing method of the present embodiment, after the forming of the insulation film including the LOCOS oxide film 31 and the interlayer insulation film 32, the insulation trench 30 is formed on the semiconductor substrate 10c from the rear surface 10b side by using the insulation film (i.e., LOCOS oxide film 31) as a stopper. Therefore, when the insulation trench 30 is formed so as to penetrate the semiconductor substrate 10c and surround each of the element forming regions 11, 12, the presence of the insulation films such as the LOCOS oxide film 31 and the inter-layer insulation film 32 maintain connection between regions of the semiconductor substrate, the connected regions including the element forming regions 11 and 12. Thus, the dropping of the element forming regions 11, 12 due to the trench formation is prevented.

According to one example manufacturing method of the present embodiment, after the semiconductor substrate 10c is thinned, the insulation trench 30 is formed. Therefore, it becomes easy to form the trench in the semiconductor substrate 10c and to fill the trench with the insulator. Further, although, as described above, the insulation trench 30 has the insulator film in the trench, it is unnecessary to perform a process of thinning a surface where the insulation film in the trench and the semiconductor substrate 10c co-exist. If thinning is performed by CMP, stresses due to the polishing may be concentrated on a boundary between the insulation film in the trench and the semiconductor substrate 10c. Hence, generation of cracks in semiconductor substrate 10c can be prevented. Further, if the thinning is performed by etching, it is possible to prevent formation of a step that originates from a difference in etching rate between the insulation film in the trench and the semiconductor substrate 10c. That is, the rear surface 10b of the semiconductor substrate 10c is homogenously thinned.

According to the above example method of the present embodiment, after the forming of the insulation trench 30, the parts of the double-sided electrode elements 50a, 50 on the rear surface 10b side are formed, the parts including the drain electrode 21b. Alternatively, of the parts of the double-sided electrode elements 50a, 50 on the rear surface 10b side, the drain regions 20a, 20b may be formed, and then, the insulation trench 30 may be formed. Then, the common drain electrode 21 may be formed.

According to the above example method of the present embodiment, before the forming of the parts of the double-sided electrode elements 50a, 50 on the rear surface 10b side, the process of thinning the semiconductor substrate 10c to decrease a thickness of the semiconductor substrate 10c. Alternatively, the process of thinning the semiconductor substrate 10c may not be performed, depending on a thickness of the semiconductor substrate 10c.

Third Embodiment

Figure 14:
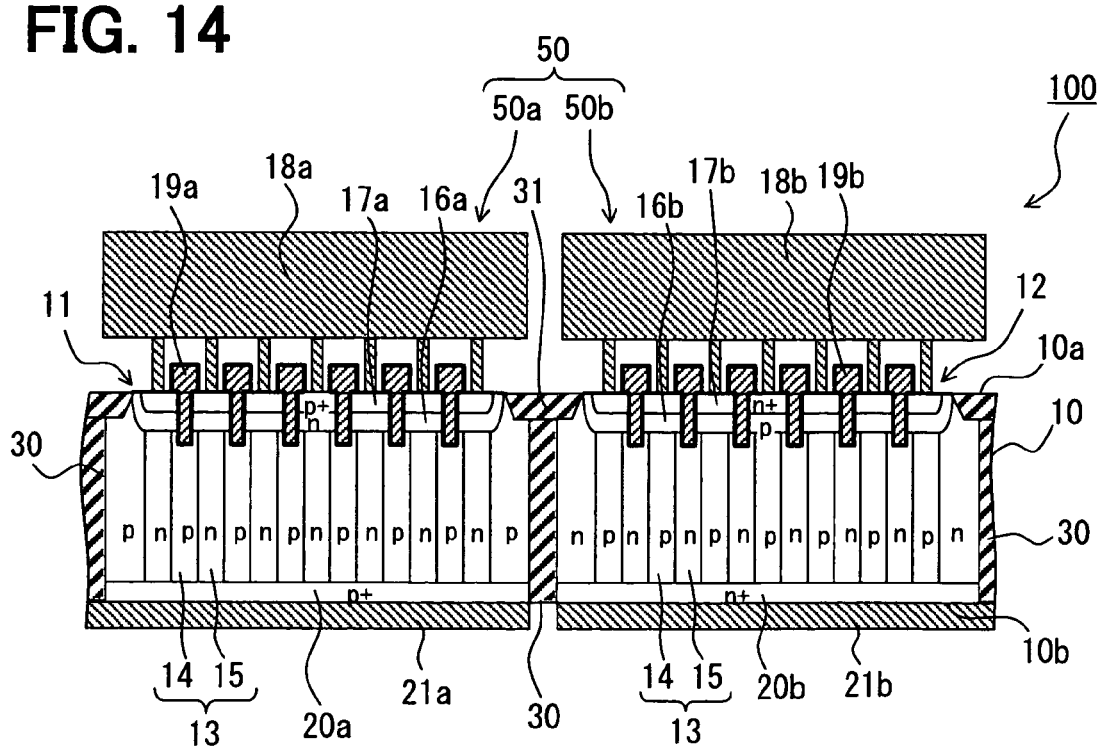
FIG. 14 is a cross sectional diagram illustrating a semiconductor apparatus in accordance with a third embodiment.

A third embodiment is described below with reference to FIG. 14. FIG. 14 is a cross sectional diagram illustrating a semiconductor apparatus in accordance with the present embodiment. FIG. 14 according to the present embodiment corresponds to FIG. 2 according to the first embodiment.

According to the first embodiment, the drain electrodes of the multiple double-sided electrode elements 50a, 50b are the common electrode 21. According to the present embodiment, as shown in FIG. 14, the drain electrode of the P channel type double-sided electrode element 50a is electrically separated or spaced away from the drain electrode 21b of the N channel type double-sided electrode element 50b. The insulation trench 30 surrounding each of the element forming regions 11 and 12 penetrates the semiconductor substrate 10 from the front surface 10a to the rear surface 10b. The source electrode 18a of the P channel type double-sided electrode element 50a is electrically separated or spaced away from the source electrode 18b of the N channel type double-sided electrode element 50b. That is, the pair of electrodes for the P channel type double-sided electrode element 50a is electrically separated from that for the N channel type double-sided electrode element 50b.

Because of the above configuration, the double-sided electrode elements 50a, 50b can be separately driven or operated. That is, the semiconductor apparatus has a multi-channel configuration. It is possible to provide a variety of circuits.

The manufacturing method according to the first or second embodiments can provide the above-configured semiconductor apparatus 100 according to the present embodiment. For example, when the insulation trench 30 is formed from the rear surface 10b side of the semiconductor substrate 10c, after the drain electrodes 21a and 21b are formed, the insulation trench 30 may be formed.

Fourth Embodiment

Figure 15:
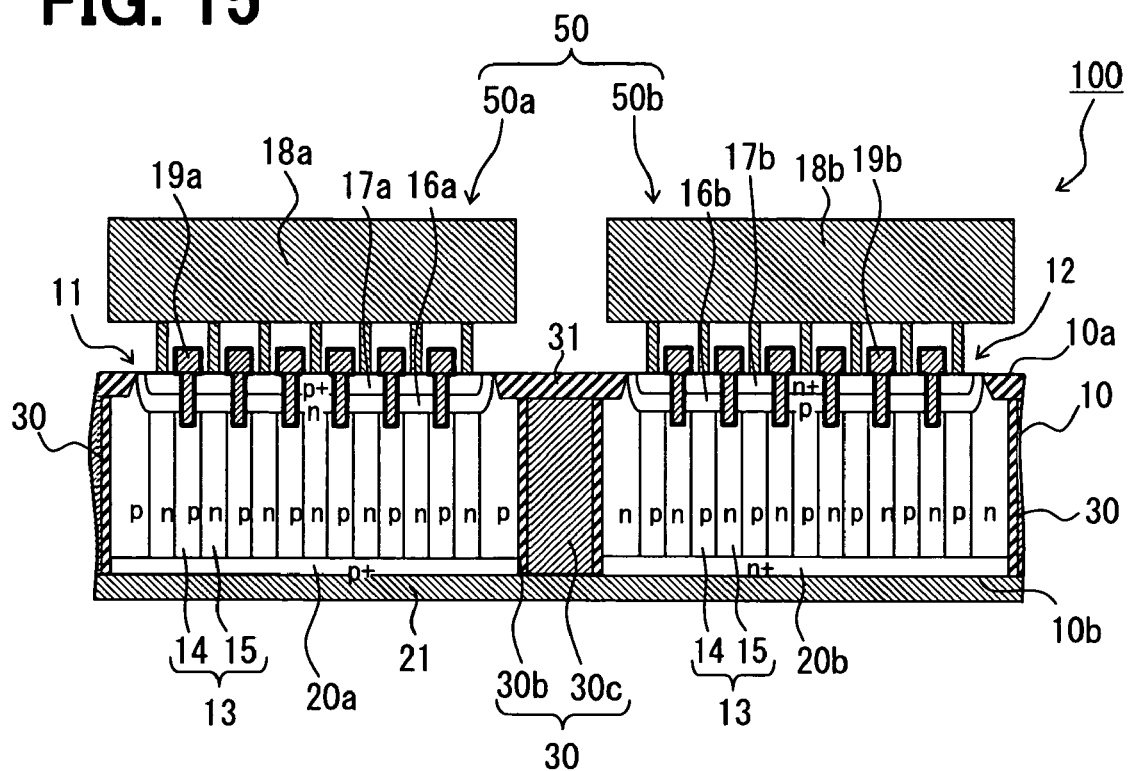
FIG. 15 is a cross sectional diagram illustrating a semiconductor apparatus in accordance with a fourth embodiment.
Figure 16:
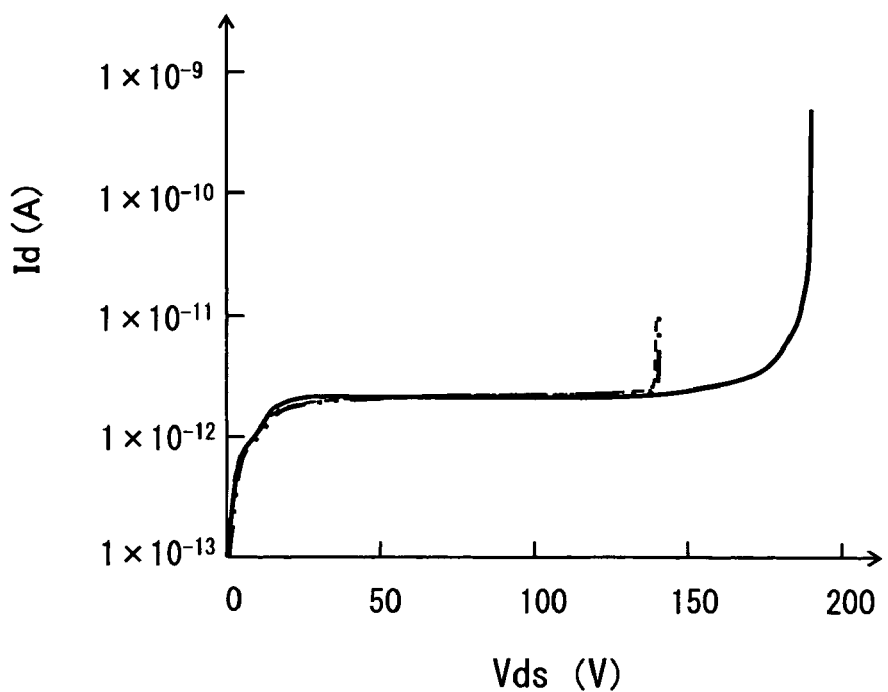
FIG. 16 is a graph shown a relation between drain current Id and drain-source voltage Vds.
Figure 17A:
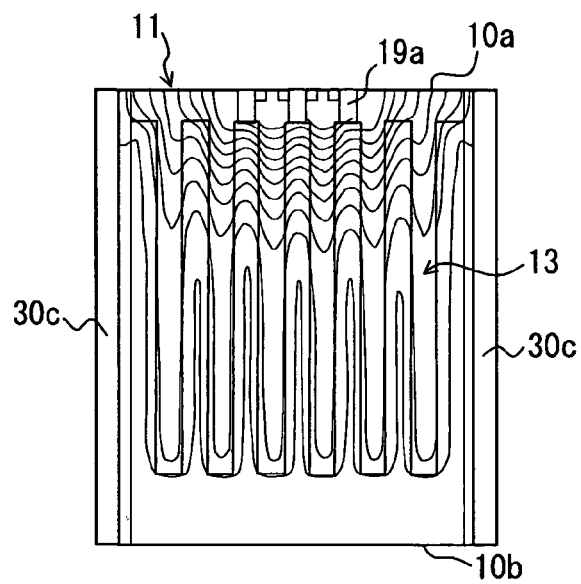
FIG. 17A is a diagram illustrating potential distribution for a case of breakdown of a semiconductor apparatus in accordance with the fourth embodiment.
Figure 17B:
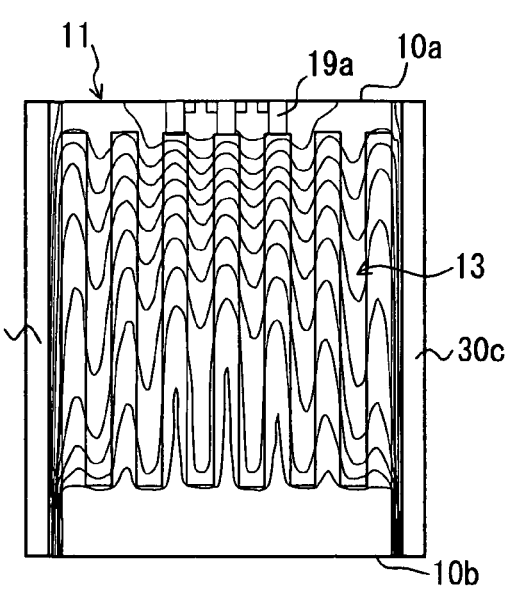
FIG. 17B is a diagram illustrating potential distribution for a case of breakdown of a semiconductor apparatus in accordance with a first comparison example.
Figure 17C:
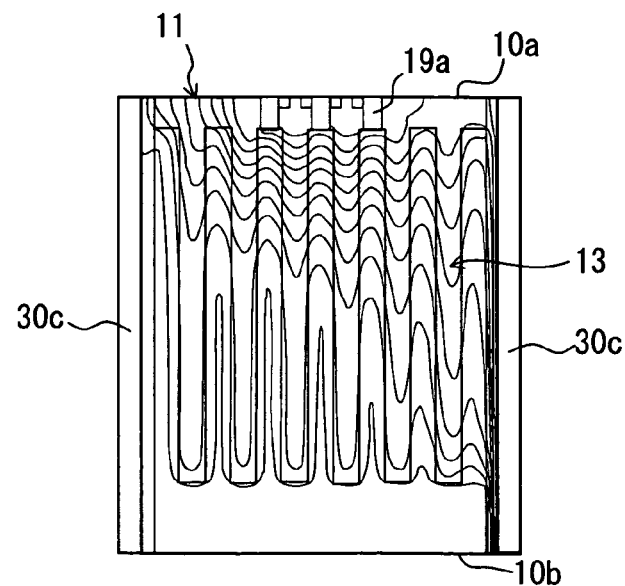
FIG. 17C is a diagram illustrating potential distribution for a case of breakdown in accordance with a second comparison example.

A fourth embodiment is described below with reference to FIGS. 15 to 17. FIG. 15 is a cross sectional diagram illustrating a semiconductor apparatus in accordance with the present embodiment. FIG. 15 corresponds to FIG. 2 according to the first embodiment. FIG. 16 is a graph showing a relation between drain current (Id) and drain-source voltage (Vds). FIG. 16 presents the drain currents (i) on a logarithmic scale. FIGS. 17A to FIG. 17C are diagrams each illustrating electric potential distribution in a semiconductor apparatus for case of breakdown. FIG. 17A shows a case of the semiconductor apparatus according to the present embodiment. FIGS. 17B and 17C respectively show cases of semiconductor apparatuses according to first and second comparison examples. The semiconductor apparatuses according to the first and second comparison examples shown in FIGS. 17B, 17C are substantially identical to the semiconductor apparatuses according to the present embodiment except the followings. In the first comparison example shown in FIG. 17B, both of the insulation trenches located on both sides of the element forming region are electrically connected with the source electrode (i.e., first electrode). In the second comparison example shown in FIG. 17C: of the trenches located on both sides of the element forming region, one is electrically connected with the source electrode (i.e., first electrode); and the other is electrically connected with the drain electrode (i.e., second electrode). In FIG. 17C, the one is illustrated on the right hand side and the other is illustrated on the left hand side.

According to the above embodiments, the insulation trench 30 is configured such that the trench is filled with the insulator (e.g., dielectric). According to the present embodiment, the insulation trench 30 has different configurations. For example, as shown in FIG. 15, a semiconductor apparatus 100 has an insulation trench 30 configured such that a trench insulation film 30b is located on a trench wall of the insulation trench 30b, and that the trench is filled with a conductor 30c through the trench insulation film 30b.

Since the trench is filled with the conductor 30c through the trench insulation film 30b, two parasitic capacitors connected in serial are provided between the adjacent element forming regions 11 and 12. Each of the two parasitic capacitors has a dielectric provided by the trench insulation film 30b. The above configuration with the two parasitic capacitors has a total capacitance smaller than the configuration with the single parasitic capacitor that is provided by the single insulation trench filled with the insulator (e.g., dielectric). Consequently, it is possible to minimize a displacement current that flows in response to voltage fluctuation. Further, when the transient signal propagates between the parasitic capacitors, the transient signal loses its energy due to a resistance. Therefore, the semiconductor apparatus according to the present embodiment can efficiently reduce or restrict propagation of the transient signal (e.g., surge).

Further, according to the example configuration shown in FIG. 15, the conductor 30c is electrically connected with the drain electrode 21, so that the conductor 30c and the drain electrode 201 have a substantially same electrical potential. It is possible to discharge the electrical charges stored in the parasitic capacitors into a drain electrode 21 side. As a result, it is possible to restrict the propagation of the transient signal such as surge or the like more efficiently. In the above example configuration, the conductor 30c is electrically connected with the drain electrode 21. Alternatively, the conductor 30c may be electrically connected with the source electrode 18a, 18b. Alternatively, the conductor 30c may be electrically connected with an element located on the front surface 10a side of the semiconductor substrate 10. The element is for example a line (e.g., GND pattern) having a predetermined potential. That is, it is possible to restrict the propagation of the transient signal such as surge or the like more efficiently, due to the configuration which fixes an electrical potential of the conductor 30c to a predetermined value.

When, as shown in FIG. 15, the conductor 30c is connected with the drain electrode 21, the semiconductor apparatus can have a simplified configuration compared to a case where the element located on the front surface 10a side causes the electrical potential of the conductor 30c to be fixed. This is because an electrode, a line, and the like may be concentrated in the front surface 10a side.

Further, it is possible to increase a breakdown voltage of the double-sided electrode element 50a, 50b compared to a case where an electric potential of the conductor 30c is substantially equal to that of the source electrode 18a, 18b (i.e., first electrode). The inventors have revealed the above advantage based on numerical simulations. As shown by the solid line in FIG. 16, the numerical simulations show that the semiconductor apparatus 100 according to the present embodiment ensures a breakdown voltage of 189.5 V. In the semiconductor apparatus 100, the conductors 30c of respective insulation trenches located on both sides of the element forming region 11 are connected with the drain electrode 21 (i.e., second electrode). As shown by the dashed line in FIG. 16, the numerical simulations show that the semiconductor apparatus according to the first comparison example has a breakdown voltage of 139.8 V. According to the first comparison example, the conductors 30c of respective insulation trenches located on both sides of the element forming region 11 are connected with the source electrode 18 (i.e., first electrode). As shown by the dashed-tow dotted line in FIG. 16, the numerical simulations show that the semiconductor apparatus according to the second comparison example has a breakdown voltage of 140.3 V. According to the second comparison example, one of the conductors 30c of the insulation trenches located on both sides of the element forming region 11 is connected with the source electrode 18, and the other of the conductors 30c is connected with the drain electrode 21.

According to the first and second comparison examples 1, 2 shown in FIGS. 17B and 17c, equi-potential planes are curved around the insulation trench 30 that has the conductor 30c connected with the source electrode 18, resulting in a large electric potential gradient and a high electric field intensity. The electric field for a case of the semiconductor apparatus 100 of the present embodiment has a lower intensity than those for cases of the first or second comparison examples 1, 2. The simulations demonstrate that the electrical connection between the conductor 30c of the insulation trench 30 and the drain electrode 21 (i.e., second electrode) improves a breakdown voltage of the double-sided electrode element 50a, 50b.

Figure 18:
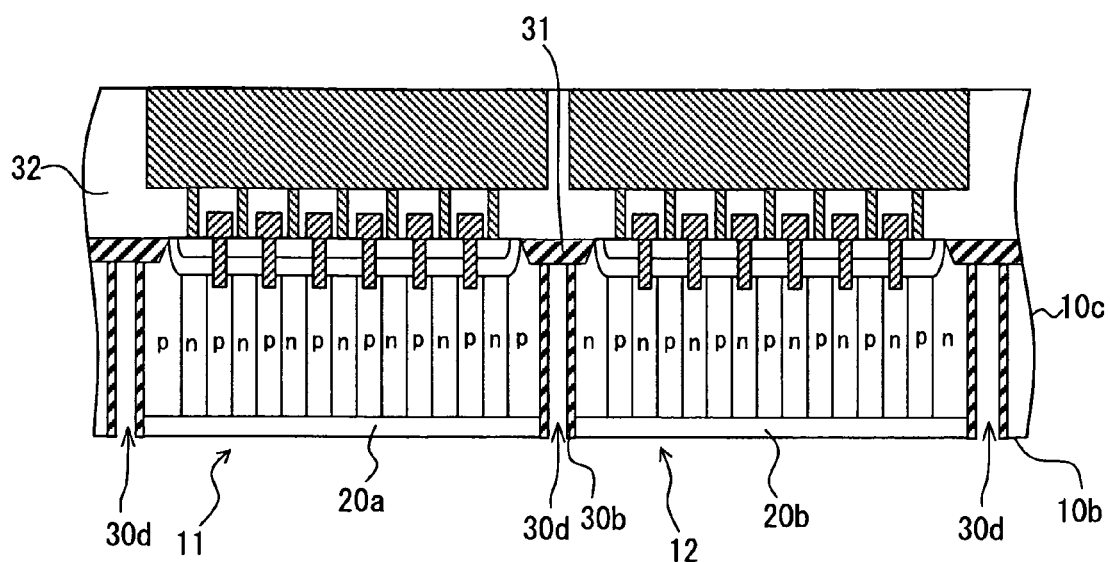
FIG. 18 is a cross sectional diagram illustrating a process of forming an insulation film on a trench wall.
Figure 19:
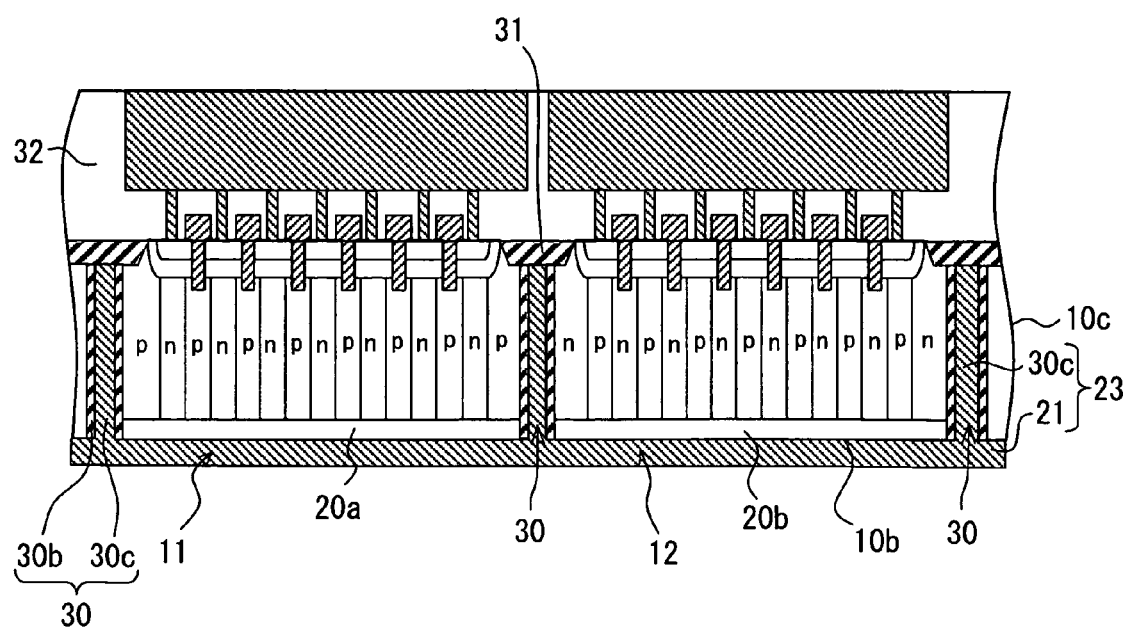
FIG. 19 is a cross sectional diagram illustrating a process of filling the trench with a conductor.

The above configured semiconductor apparatus 100 can be manufactured by the method shown in the first or second embodiments. Processes of forming the insulation trench 30 on the semiconductor substrate 10c from the rear surface 10b side is described below with reference to FIGS. 18 and 19. FIG. 18 is a cross sectional diagram associated with a process of forming an insulation film located on the trench wall of the trench and associated with processes performed before the forming of the insulation film. FIG. 18 is a cross sectional diagram illustrating a process of filling the trench with a conductor.

The parts on the front surface side are formed in a manner similar to that shown in the second embodiment, and then, the thinning process is performed as needed. Then, as shown in FIG. 18, impurities are implanted into the semiconductor substrate 10c from the rear surface 10b side by, for example, ion implantation. Thereby, the drain regions 20a, 20b of respective P channel and N channel type double electrode elements 50a, 50b are formed. Then, by using the LOCOS oxide film 31 as a stopper, the trench 30d is formed by anisotropic dry etching, so that the trench 30d reaches the LOCOS oxide film 31 and surrounds the element forming regions 11, 12. The trench insulation film 30b made of, for example, silicon oxide, is formed on a trench wall of the trench 30d by thermal oxidation, CVD, or the like. In the above process, the trench 30d is not fully filled with the trench insulation film 30b but has a cavity along a central axis of the trench 30d, as shown in FIG. 18.

The cavity of the trench 30d is filled with a conductive member 23 and the conductive member 23 is deposited on the rear surface 10b of the semiconductor substrate 10c. Through the above manners, the insulation trench 30 having the conductive member 23 inside the trench is formed, and the drain electrode 21 provided by the conductive member 23 is formed. The semiconductor apparatus 100 is provided that has the conductor 30c and the drain electrode 21 electrically connected with each other.

According to the above example processes of the present embodiment, after the drain regions 20a, 20b are formed, the trench 30d and the trench insulation film 30b are formed. Alternatively, the trench 30d and the trench insulation film 30b may be formed before the forming of the drain regions 20a, 20b.

Alternatively, the insulation trench 30 may be formed on the semiconductor substrate 10c from the front surface 10a side in a manner similar to that shown in the first embodiment. In the above alternative case, the insulation trench 30a may be formed through: forming the trench insulation film 30b on the trench wall of the trench 30d so that the trench 30d has a cavity; the conductive member 23 is deposited in the cavity. The formed insulation trench 30a is in the not-complete penetrating state, and has the conductor 30c that is provided by the conductive member 23 in the trench 30d. After the insulation trench 30a is formed, the semiconductor substrate 10c is thinned until the conductor 30c is exposed. Then, the parts of the double-sided electrode elements 50a, 50b on the rear surface 10b side are formed, so that the semiconductor apparatus 100 is provided that has the conductor 30c and the drain electrode 21 electrically connected with each other.

Figure 20:
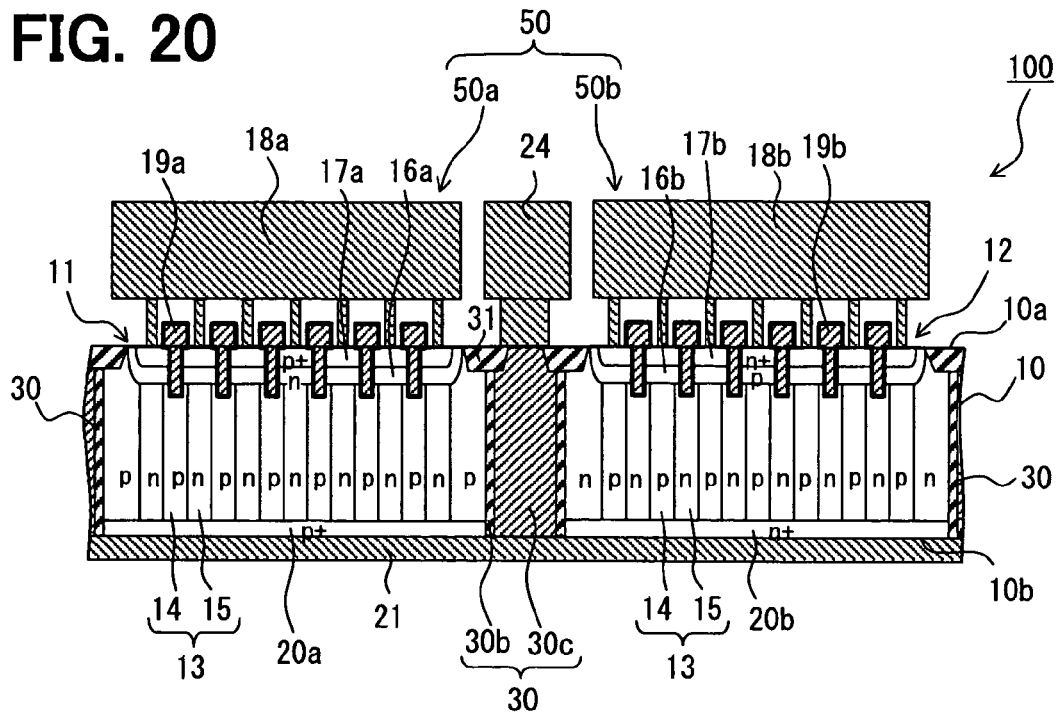
FIG. 20 is a cross sectional diagram illustrating a semiconductor apparatus in accordance with a modification example of the fourth embodiment.

According to the above example processes of the present embodiment, the conductor 30c of the insulation trench 30 is electrically connected with the drain electrode 21 (i.e., second electrode) at the rear surface 10b side of the semiconductor substrate 10. Alternatively, as shown in FIG. 20, the conductor 30c may be further formed on the front surface of the semiconductor substrate 10, and may be electrically connected with a line 24 that is electrically separated from the source electrodes 18a, 18b. In the above case, an electric potential of the drain electrode can be monitored through the line 24 and the conductor 30c. Since the electric potential of the drain electrode 21 can be measured by, for example, contacting a tester with a pad of the line, simplification of a measurement device is possible. FIG. 20 is a cross sectional diagram illustrating a modification example of the semiconductor apparatus according to the present embodiment. FIG. 20 corresponds to FIG. 2.

To provide electrical connection between the conductor 30c and the line 24 on the front surface 10a side of the semiconductor substrate 10, the following manufacturing processes may be employed. The trench 30d is formed. The trench insulation film 30b is formed on the trench wall of the trench 30d so that a cavity is left in the trench. Then, by using the line 24 as a stopper, a portion of the trench insulation film 30b located on the bottom of the trench 30d and the LOCOS oxide film 31 are removed by anisotropic etching (e.g., ion beam etching). The bottom of the trench 30d is located on the front surface 10a side. Then, the cavity of the trench 30d is filled with the conductive member 23.

According to the modification example shown in FIG. 20, the electric potential of the drain electrode 21 can be monitored through the line 24 that is connected with the conductor 30c on the front surface 10a side of the semiconductor substrate 10. Alternatively, the conductor 30c may be electrically connected with another element through the line 24, which another element is located on the semiconductor substrate 10 and is different form the double-sided electrode element 50a, 50b whose drain electrode is electrically connected with the subject conductor 30c. In the above alternative configuration, it is possible to improve a function of a circuit that includes multiple elements in the same semiconductor substrate 10. The function is, for example, feedback control based on the electric potential of the drain electrode 21.

Fifth Embodiment

Figure 21:
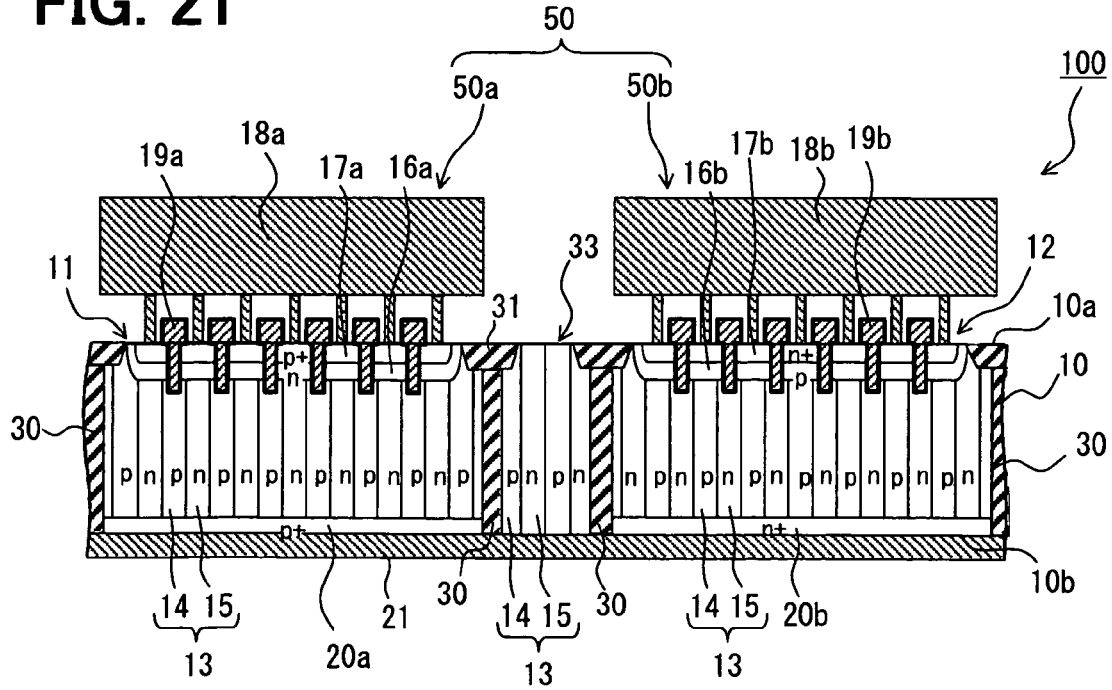
FIG. 21 is a cross sectional diagram illustrating a semiconductor apparatus in accordance with a fifth embodiment.

A fifth embodiment is described below with reference to FIGS. 21 and 22. FIG. 21 is a cross sectional diagram illustrating a semiconductor apparatus in accordance with the present embodiment. FIG. 21 corresponds to FIG. 2 according to the first embodiment. FIGS. 22A and 22B are plan views illustrating semiconductor apparatuses in according with the present embodiment.

According to the above embodiments, the single insulation trench 30 is located between the element forming regions 11 and 12. In the present embodiment, multiple insulation trenches 30 are located between the element forming regions 11 and 12. For example, as shown in FIG. 22, two insulation trenches 30 are located between the element forming regions 11 and 12. Each of the two insulation trenches 30 is configured such that a trench is filled with an insulator (i.e., dielectric). A region between the two insulation trenches 30 is an inter-element region 33, which is between the element forming regions 11 and 12. The inter-element region 33 includes the PN column region having the multiple P conductivity type parts and the multiple N conductivity type parts. The inter-element region 33 is electrically connected with the drain electrode 21. An electric potential of the inter-element region 33 is substantially equal to that of the drain electrode 21.

Since the multiple insulation trenches 30 are disposed between the element forming regions 11 and 12, two or more parasitic capacitors connected in series are provided between the element forming regions 11 and 12. Each parasitic capacitor has the dielectric provided by the insulator in the trench. The above configuration with the two or more parasitic capacitors has a total capacitance smaller than the configuration with the single parasitic capacitor that is provided by the single insulation trench filled with the insulator (e.g., dielectric). Consequently, it is possible to minimize a displacement current that flows in response to voltage fluctuation. When the transient signal propagates through or between the parasitic capacitors, the transient signal loses energy due to a resistance of the inter-element region 33. Therefore, the semiconductor apparatus according to the present embodiment can efficiently reduce or restrict propagation of the transient signal (e.g., surge).

As shown in FIG. 21, since the inter-element region 33 has the PN column region 13, a parasitic capacitor that utilizes a depletion layer as a dielectric is provided in the inter-element region 33. That is, parasitic capacitors provided between the adjacent element forming regions 11 and 12 can have a smaller capacitance. Therefore, it is possible to more efficiently restrict propagation of the transient signal such as a surge or the like. Alternatively, instead of the PN column region 13, the inter-element region 33 may have a semiconductor region having, for example, N conductivity type or N+ conductivity type.

Further, as shown in FIG. 21, since the inter-element region 33 is electrically connected with the drain electrode 21. It is possible to discharge the electrical charges stored in the parasitic capacitors into a drain electrode 21 side. As a result, it is possible to more efficiently restrict the propagation of the transient signal such as surge or the like. In the above example configuration, the inter-element region 33 is connected with the drain electrode 21. Alternatively, the inter-element region 33 may be connected with the source electrode 18a, 18b. Alternatively, the inter-element region 33 may be electrically connected with an element located on a front surface 10a side of the semiconductor substrate 10. Such an element is for example a line (e.g., GND pattern) having a predetermined potential. That is, it is possible to more efficiently restrict the propagation of the transient signal such as surge or the like when the inter-element region 33 is configured to have an electrical potential fixed to a predetermined value.

When, as shown in FIG. 21, the inter-element region 33 is connected with the drain electrode 21, the semiconductor apparatus can have a simplified configuration compared to a case where an element located on the front surface 10a side fixes the electrical potential of the conductor 30c. This is because an electrode, a line and the like are concentrated on the front surface 10a side of the semiconductor substrate 10.

Figure 22A:
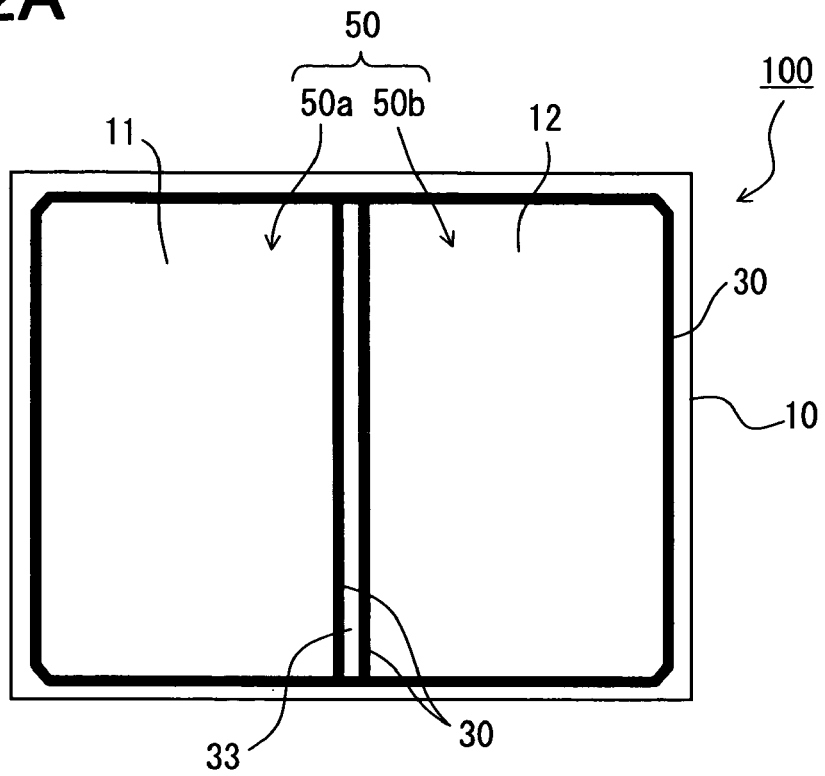
FIGS. 22A and 22B are plan views illustrating semiconductor apparatuses in accordance with the fifth embodiment.
Figure 22B:
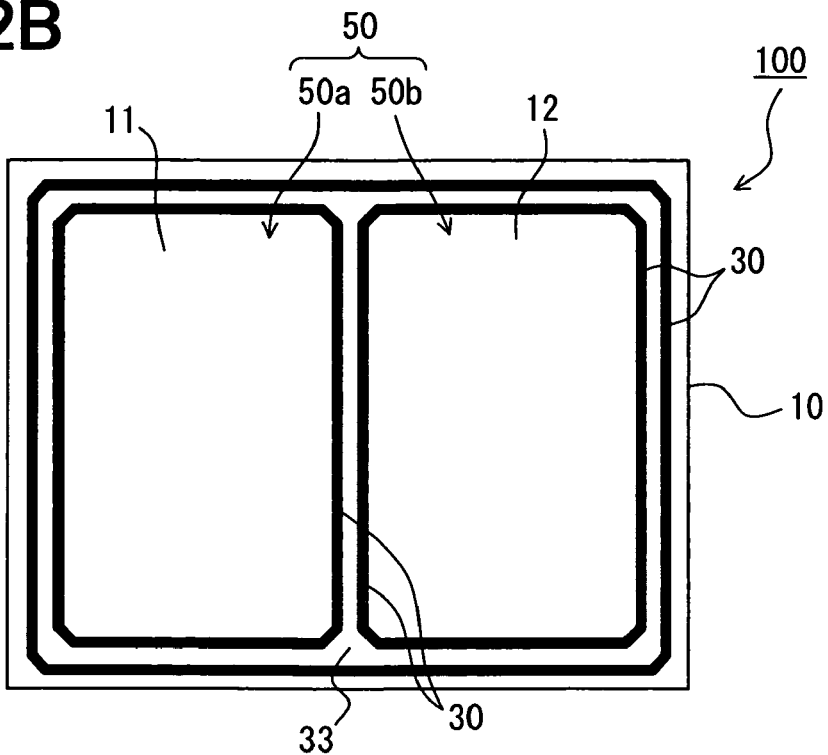

FIG. 22A and FIG. 22B shows example of the multiple insulation trenches between the adjacent element forming regions 11 and 12. Specifically, in the example shown in FIG. 22A, the multiple (i.e., two) insulation trenches 30 are located only in a region between the element forming regions 11 and 12. The single insulation trench 30 is located in a region surrounding the element forming regions 11, 12 except the region between the element forming regions 11 and 12. In the above configuration, the inter-element region 33 is provided only a region between the element forming regions 11 and 12 (i.e., sandwiched region). The element forming regions 11, 12 can occupy a large space when the size of the semiconductor apparatus 100 is kept constant. Alternatively, the semiconductor apparatus 100 can have a smaller size. In another example configuration shown in FIG. 22B, a single insulation trench 30 surrounds each of the element forming regions 11 and 12, and another single insulation trench 30 surrounds the whole of the element forming regions 11, 12. In the above configuration, an entire perimeter of each element forming region 11, 12 is surrounded by the multiple insulation trenches 30 or the inter-element region 33. It is possible to restrict the propagation of the transient signal to a periphery region. Furthermore, the multiple insulation trenches 30 can improve a breakdown voltage.

According to the example configurations of the present embodiment, the multiple insulation trenches 30 located between the adjacent element forming regions 11, 12 are configured such that each trench is filled with the insulator (i.e., dielectric). Alternatively, the insulation trench 30 may be, as similar to that according to the fourth embodiment, such that the insulation film is located in the trench wall of the trench and the trench is filled with the conductor through the insulation film.

Figure 23:
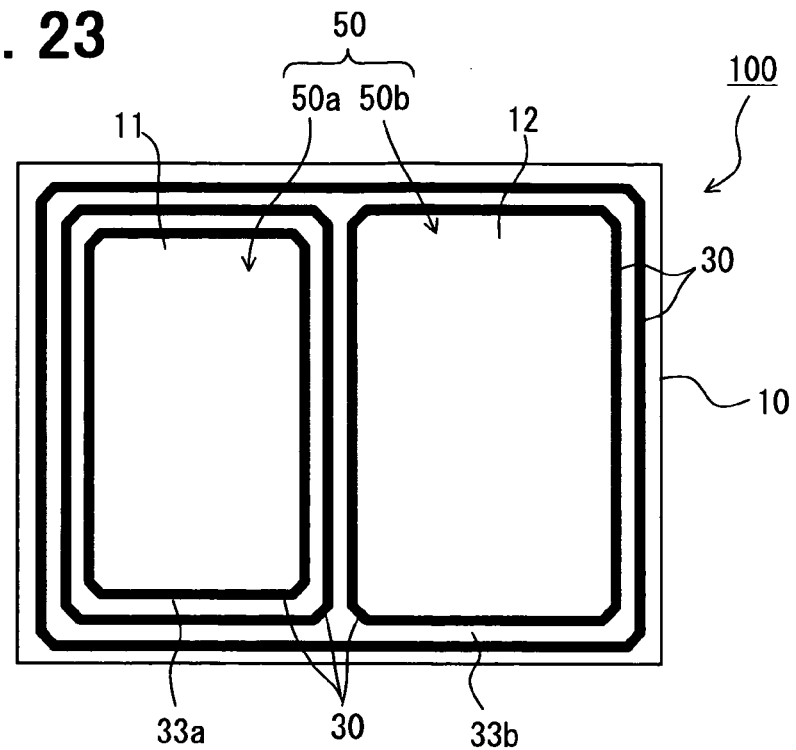
FIG. 23 is a plan view illustrating a semiconductor apparatus in accordance with a modification example of the fifth embodiment.

According to one example configuration of the present embodiment, the two insulation trenches 30 are located between the adjacent element forming regions 11 and 12. Alternatively, the number of the insulation trenches 30 may be more than two. Alternatively, the number of the insulation trench associated with the element forming region 11 may be different from the number of the insulation trench associated with the element forming region 12. For example, as shown in FIG. 23, the element forming region 11 is surrounded by three insulation trenches 30 surround, and the element forming regions 12 is mostly surrounded by two insulation trenches 30. Three insulation trenches 30 are located between the adjacent element forming regions 11 and 12. According to the above configuration, the double-sided electrode elements 50a, 50b having different breakdown voltages can be integrated into a single semiconductor substrate 10. FIG. 23 is a plan view illustrating a modification example of the semiconductor apparatus in accordance with the present embodiment.

Modified Embodiments

The above embodiments can be modified in various ways. Examples of modified embodiments are described below.

According to the above embodiments, the semiconductor substrate 10, 10c is made of silicon. Alternatively, the semiconductor substrate 10, 10c may be made of another semiconductor material, for example, silicon carbide (SiC).

According to the above embodiments, a vertical type MOS transistor element is used as an example of the double-sided electrode element 50(50a, 50b) that utilizes the PN column region 13 as a drift region. Alternatively, another active element may be used as the double-sided electrode element 50(50a, 50b). The another active element is, for example, an insulated gate bipolar transistor (IGBT). Alternatively, in addition to the double-sided electrode element 50(50a, 50b), another element may be arranged in the same semiconductor substrate 10. The another element is, for example, a diode, a resistance, or the like each configured such that a pair of electrodes for the another element are respectively located on the front surface 10a side and the rear surface 10b side, and that a current flows between the pair of electrodes. In the above case, the element (e.g., diode) may be configured with or without the PN column region 13.

According to the above embodiments, the gate electrodes 19a, 19b of the double-sided electrode elements 50a, 50b have a trench structure. Alternatively, the gate electrodes of the double-sided electrode elements 50a, 50b may have a planar structure or a concave structure.

According to the above embodiments, the semiconductor apparatus 100 includes two double-sided electrode elements 50 each utilizing the PN column region 13 as a drift region. Alternatively, the semiconductor apparatus 100 may include multiple double-sided electrode elements 50, for example, the semiconductor apparatus 100 may include more than two double-sided electrode elements 50.

Figure 24:
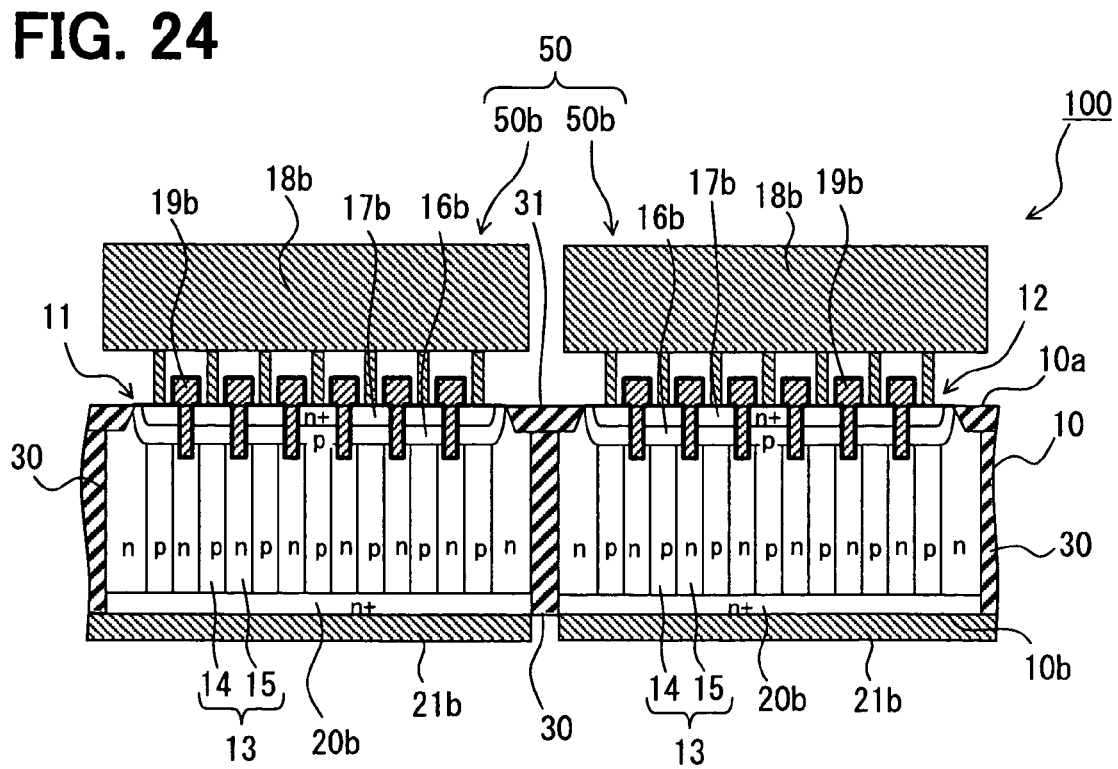
FIG. 24 is a cross sectional diagram illustrating a semiconductor apparatus in accordance with a first example of modified embodiments.

According to the above embodiments, multiple (i.e., two) double-sided electrode elements 50 are provided by the P channel type double-sided electrode element 50a and the N channel type double-sided electrode element 50b. Alternatively, the multiple double-sided electrode elements 50 may be either multiple P channel type double-sided electrode elements 50a or multiple N channel type double-sided electrode elements 50b. For example, as shown in FIG. 24, a semiconductor apparatus 100 includes two N channel type double-sided electrode elements 50b (i.e., N channel type vertical MOS transistor elements) as the multiple double-sided electrode elements 50. FIG. 24 is a cross sectional diagram illustrating a semiconductor apparatus in accordance with modified embodiments. The drain electrodes 21b of the semiconductor apparatus 100 shown in FIG. 24 are separated and spaced away from each other. Alternatively, the drain electrodes 21b may be integrated into a common electrode. Alternatively, the semiconductor apparatus 100 may include multiple P channel type double-sided electrode elements 50a and multiple double-sided electrode elements 50b.

Figure 25:
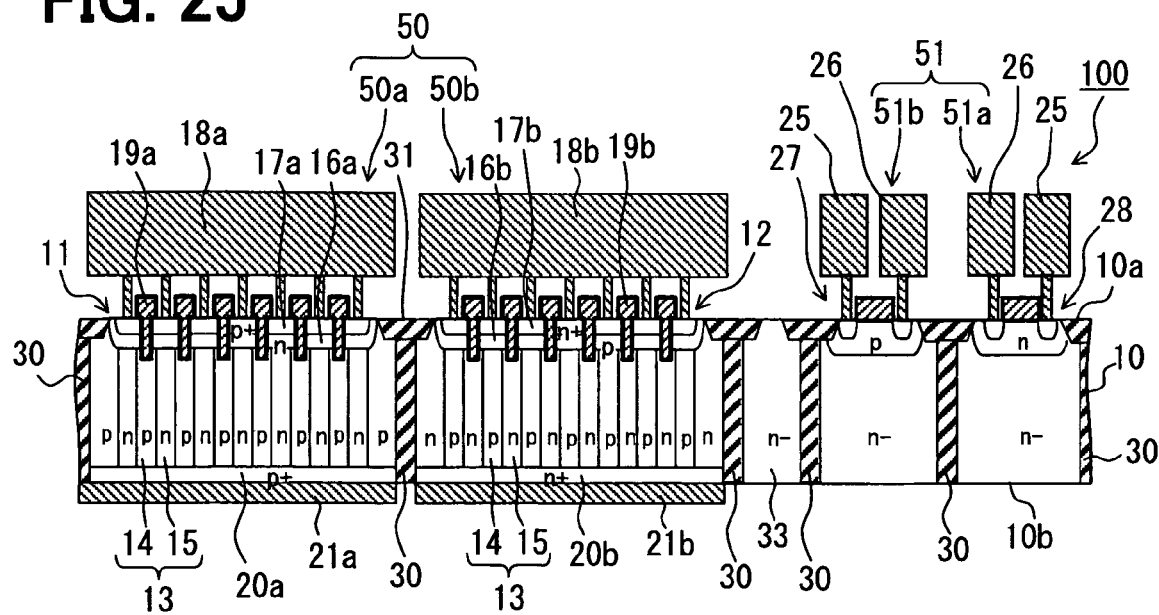
FIG. 25 is a cross sectional diagram illustrating a semiconductor apparatus in accordance with a second example of the modified embodiments.

According to the above embodiments, the semiconductor apparatus includes the multiple double-sided electrode elements 50 as the elements arranged in the semiconductor substrate 10. The semiconductor apparatus may further include a single-sided electrode element that is located in a region different from the element forming region for the double-sided electrode element 50. The single-sided electrode element has a pair of electrode, both of which are located on one of the front surface 10*a* side and the rear surface 10*b* side of the semiconductor substrate 10. In the single-sided electrode element, a current flows between the pair of electrodes. For example, as shown in FIG. 25, a semiconductor apparatus 100 includes the above-described multiple double-sided electrode elements 50 (50*a*, 50*b*), and further includes single-sided electrode elements 51(51*a*, 51*b*). A source electrode and a drain electrode of each single-sided electrode element 51 (51*a*, 51*b*) is located on the front surface 10*a* side of the semiconductor substrate 10. The semiconductor apparatus 100 shown in FIG. 25 has element forming regions 27, 28 for respective single-sided electrode elements 51 (51*a*, 51*b*). The single-sided electrode element 51*a* is a lateral type MOS transistor element as a P channel type single-sided electrode element. The single-sided electrode element 51*b* is a lateral type MOS transistor element as an N channel type single-sided electrode element. In such a configuration, the double-sided electrode element 50 and the single-sided electrode element is integrated into single semiconductor substrate 10. It is possible to provide a semiconductor apparatus (i.e., a hybrid IC or a compound IC) that has an integrated control circuit or an integrate protection circuit. Further, as shown in FIG. 25, multiple (e.g., two) insulation trenches 30 are located between the adjacent element forming regions 12, 27 in which the double-sided electrode element 50 and the single-sided electrode element 51 are respectively located. Since an electric potential difference between the double-sided electrode element 50 for power application and the single-sided electrode element 51 can be large, it may be preferable that the multiple insulation trenches 30 be located between the element forming regions 12 and 27. The multiple insulation trenches can divide the voltage or the electric potential difference. FIG. 25 is a cross sectional diagram illustrating a semiconductor apparatus in accordance with the modified embodiments. The single-sided electrode element 51 may be a lateral type MOS transistor. Alternatively, the single-sided electrode element 51 may be a bipolar transistor element, complementary MOS transistor element, a diode, a capacitor, a resistance, a wiring, or the like.

Figure 26:
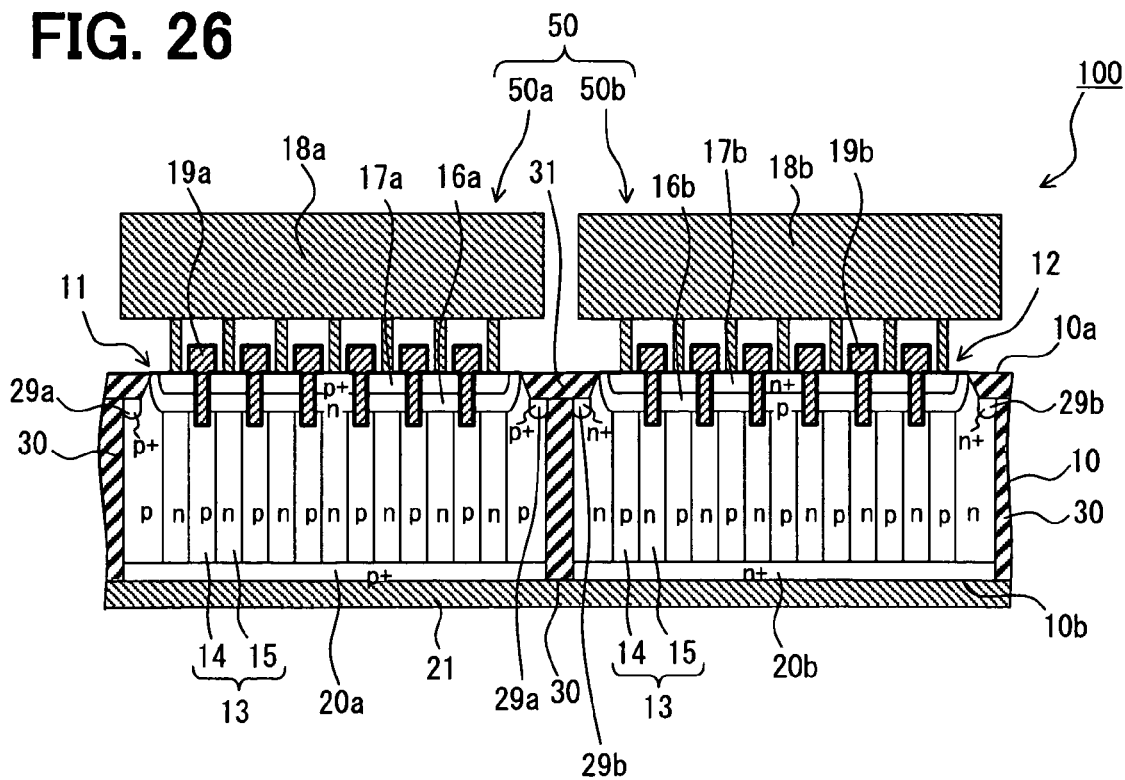
FIG. 26 is a cross sectional diagram illustrating a semiconductor apparatus in accordance with a third example of the modified embodiments.

Alternatively, as shown in FIG. 26, a semiconductor apparatus 100 further includes high concentration regions 29*a*, 29*b* in the element forming regions 11, 12, respectively. Each high concentration region 29*a*, 29*b* is located on an end of the PN column region 13 in a laminating direction of the PN column region 13. The high concentration region 29*a* is located on the PN column region of the P channel type double-sided electrode element 50*a*, and is located on the P conductivity type semiconductor part 14 that contacts the insulation trench 30, and that is an end portion of the PN column region of the P channel type double-sided electrode element 50*a*. The high concentration region 29*a* is located on the front surface 10*a* side and located just below the LOCOS oxide film 31. The high concentration region 29*a* is an impurity region having the P conductivity type, such as P+ conductivity type. The high concentration region 29*a* is formed so as to surround the element forming region 11 along the insulation trench 30. The high concentration region 29*b* is located on the PN column region of the P channel type double-sided electrode element 50*b*, and is located on the N conductivity type semiconductor part 15 that contacts the insulation trench 30, and that is an end portion of the PN column region of the N channel type double-sided electrode element 50*b*. The high concentration region 29*b* is located on the front surface 10*a* side and located just below the LOCOS oxide film 31. The high concentration region 29*a* is an impurity region having the N conductivity type, such as the N+ conductivity type. The high concentration region 29*b* is formed so as to surround the element forming region 12 along the insulation trench 30. Each high concentration region 29*a*, 29*b* has a contact member (not shown) and is electrically connected with a dedicated electrode through the contact member. FIG. 26 is a cross sectional diagram illustrating a semiconductor apparatus in accordance with the modified embodiments.

According to the above embodiments, both of the source electrodes 18*a*, 18*b* (i.e., the first electrodes) of the respective double-sided electrode elements 50*a*, 50*b* are located on the front surface 10*a* side of the semiconductor substrate 10. The common drain electrode 21 (21*a*, 21*b*) or the drain electrodes as the second electrode for the respective double-sided electrode elements 50*a*, 50*b* are located on the rear surface 10*b* side of the semiconductor substrate 10. Alternatively, one of the source electrodes 18*a*, 18*b* may be located on the front surface 10*a* side of the semiconductor substrate 10, and the other of the source electrodes 18*a*, 18*b* may be located on the rear surface 10*b* side. Further, one of the drain electrodes 21*a*, 21*b* may be located on the front surface 10*a* side of the semiconductor substrate 10, and the other of the drain electrodes 21*a*, 21*b* may be located on the rear surface 10*b* side.

According to the above embodiments, the insulation trench 30 is such that the trench is filled with the insulator, or such that the trench is filled with conductor 30*c* so as to be located inside the trench insulation film 30*b*. Alternatively, the insulation trench 30 may be such that the trench has a hollow therein or is filled with an air. When the multiple insulation trenches 30 are located in the semiconductor substrate 10, one insulation trench 30 may have one of the above three structures, and another insulation trench 30 may have another of the above three structures. The multiple insulation trenches 30 located in the same semiconductor substrate 10 may have different structures.

According to the above embodiments, the drain region 20*a*, 20*b* is located between the PN column region 13 and the drain electrode 21 with respect to the thickness direction of the semiconductor substrate 10. Alternatively, the drain region 20*a*, 20*b* may include a buffer region. The buffer region is located between the drain region 20*a*, 20*b* and the PN column region (e.g., the P conductivity type semiconductor part 14), has a conductivity type identical to that of the drain region 20*a*, 20*b*, and has an impurity concentration lower than that of the drain region 20*a*, 20*b*.

According a first aspect of the exemplary embodiments, a semiconductor apparatus is provided. The semiconductor apparatus includes a semiconductor substrate 10 that has a first surface 10*a* and a second surface 10*b* opposite to each other, and that has multiple element forming regions 11, 12, 27, 28. The semiconductor apparatus further includes an insulation trench 30 that surrounds each of the multiple element forming regions 11, 12, 27, 28, and that insulates and separates the multiple element forming regions 11, 12, 27, 28 from each other. The semiconductor apparatus further includes multiple elements 50, 50*a*, 50*b*, 51, 51*a*, 51*b* that is respectively located in the multiple element forming regions 11, 12, 27, 28. The multiple elements 50, 50*a*, 50*b*, 51, 51*a*, 51*b* include at least two double-sided electrode elements 50, 50*a*, 50*b*. Each double-sided electrode element 50, 50*a*, 50*b* includes a first electrode 18*a*, 18*b* that is located on one of the first surface 10*a* and the second surface 10*b* of the semiconductor substrate 10. Each double-sided electrode element 50, 50*a*, 50*b* further includes a second electrode 21, 21*a*, 21*b* that is located on the other of the first surface 10*a* and the second surface 10b of the semiconductor substrate 10. Each double-sided electrode element 50, 50a, 50b is configured so that a current flow between the first electrode 18a, 18b and the second electrode 21, 21a, 21b. Each double-sided electrode element 50, 50a, 50b further includes a PN column region 13 that is located in the semiconductor substrate 10, and that includes multiple P conductivity type semiconductor parts 14 and multiple N conductivity type semiconductor parts 15. The multiple P conductivity type semiconductor parts 14 and the multiple N conductivity type semiconductor parts 15 are alternately and adjacently arranged in a direction perpendicular to a thickness direction of the semiconductor substrate 10. Each double-sided electrode element 50, 50a, 50b further includes a drift region that is provided by one of the multiple P conductivity type semiconductor parts 14 and the multiple N conductivity type semiconductor parts 15 of the PN column region 13.

According to the semiconductor apparatus, each of the element forming regions 11, 12 for the double-sided electrode element 50, 50a, 50b includes the PN column region 13 in the semiconductor substrate 10. Further, the drift region of each double-side electrode element 50, 50a, 50b is provided by the PN column region 13. Therefore, each of the multiple double-sided electrode elements 50, 50a, 50b arranged in the same semiconductor substrate 10 can have a high breakdown voltage and a low on-state resistance.

Further, the insulation trench 30 surrounds each of the multiple double-sided electrode elements 50, 50a, 50b. The multiple double-sided electrode elements 50, 50a, 50b each having the PN column region 13 are separated and insulated from each other by the insulation trench 30. Therefore, the semiconductor apparatus can have an element separation region with a smaller width or a smaller area compared to a case where the element separation region is provided by PN junction separation, if breakdown voltages are the same. Consequently, it is possible to provide the semiconductor apparatus with a smaller size. Alternatively, it is possible to provide the higher-integrated semiconductor apparatus if the sizes are the same. Further, it is possible to decrease manufacturing cost. It is also possible to provide the semiconductor apparatus with a higher breakdown voltage compared to the case where the element separation region is provided by PN junction separation, if the element separation regions have the same size or the same area.

Further, since the insulation trench 30 is used as the element separation region, if a transient signal is applied, it is possible to more efficiently restrict or reduce an occurrence of short-circuiting caused by a parasitic effect, compared to the case where the PN junction separation is used as the element separation region. The transient signal may be a surge (e.g., dv/dt surge) or an extra part of an AC signal.

Through the above manners, it possible to provide a semiconductor apparatus that includes the double-sided electrode elements 50, 50a, 50b each having a PN column region 13, the semiconductor apparatus being capable of having a smaller size and restricting an occurrence of short-circuiting caused by a transient signal.

The double-sided electrode element 50, 50a, 50b may be an active element that has a pair of the electrodes (i.e., the first electrode 18a, 18b and the second electrode 21, 21a, 21b) respectively located on the one of the first and second surfaces 10a, 10b of the semiconductor substrate 10, that has a drift region provided by the PN column region 13, and that is configured such that a current flows between the first and second electrodes 18a, 18b, 21, 21a, 21b. Such a double-sided electrode element 50, 50a, 50b may be a vertical type transistor element. More specifically, the double-sided electrode element 50, 50a, 50b may be a vertical type MOS transistor element. Alternatively, the double-sided electrode element 50, 50a, 50b, which has the first electrode 18a, 18b and the second electrode 21, 21a, 21b respectively located on the one of the first and second surfaces 10a, 10b of the semiconductor substrate 10, may be a diode or a resistor. The diode or resistor may include the PN column region 13.

The semiconductor apparatus may be configured such that: the at least two double-sided electrode elements 50, 50a, 50b includes one of at least two P channel type double-sided electrode elements 50, 50a and at least two N channel type double-sided electrode elements 50, 50b; the drift region of each P channel type double-sided electrode element 50, 50a is provided by the multiple P conductivity type semiconductor parts 14 of the PN column region 13; and the drift region of each N channel type double-sided electrode element 50, 50b is provided by the multiple N conductivity type semiconductor parts 15 of the PN column region 13.

According to the above configuration, the multiple double-sided electrode elements 50, 50a, 50b that can create channels with a same conductivity type are integrated into the semiconductor substrate 10. In such a configuration, only the multiple N channel type double-sided electrode elements 50, 50b may be integrated, or, only the multiple P channel type double-sided electrode elements 50, 50a may be integrated. Alternatively, the multiple N channel type double-sided electrode elements 50, 50b and the multiple P channel type double-sided electrode elements 50, 50a may be integrated into the same semiconductor substrate 10.

The semiconductor apparatus may be configured such that: the at least two double-sided electrode elements 50, 50a, 50b include at least one P channel type double-sided electrode element 50, 50a and at least one N channel type double-sided electrode element 50, 50b; the drift region of the P channel type double-sided electrode element 50, 50a is provided by the multiple P conductivity type semiconductor parts 14; and the drift region of the N channel type double-sided electrode element 50, 50b is provided by the multiple N conductivity type semiconductor parts 15 of the PN column region 13.

According to the above configuration, as described above, each element forming region 11, 12 for the double-sided electrode element 50, 50a, 50b has the multiple P conductivity type semiconductor parts 14 and the N conductivity type semiconductor parts 15. Therefore, the N channel type double-sided electrode element 50, 50b and the P channel type double-sided electrode element 50, 50a can be integrated into the same semiconductor substrate 10.

The semiconductor apparatus may be configured such that: each double-sided electrode element 50, 50a, 50b has a channel region 16a, 16b; the channel region 16a, 16b is located in the semiconductor substrate 10; the channel region 16a, 16b is located between the PN column region 13 and the first surface 10a of the semiconductor substrate 10; a conductivity type of the channel region 16a, 16b of each double-sided electrode element 50, 50a, 50b is opposite to that of the drift region of the double-sided electrode element 50, 50a, 50b; and the first electrode 18a, 18b 18a, 18b and the second electrode 21, 21a, 21b of each double-sided electrode element 50, 50a, 50b are respectively located on the first surface 10a and the second surface 10b of the semiconductor substrate 10. According to the above configuration, it is possible to simplify a configuration of the semiconductor apparatus, and it is possible to simplify manufacturing processes.

The semiconductor apparatus may be configured such that respective second electrodes 21, 21a, 21b of the at least two double-sided electrode elements 50, 50a, 50b are integrated into a common electrode 21, so that respective second electrodes 21, 21a, 21b of the at least two double-sided electrode elements 50, 50a, 50b has a same electric potential.

Alternatively, the semiconductor apparatus may be configured such that: the first electrode 18a, 18b of one of the at least two double-sided electrode elements 50, 50a, 50b is electrically separated from the first electrode 18a, 18b of another one of the at least two double-sided electrode elements 50, 50a, 50b; and the second electrode 21a, 21b of the one of the at least two double-sided electrode elements 50, 50a, 50b is electrically separated from the second electrode 21a, 21b of the another one of the at least two double-sided electrode elements 50, 50a, 50b. According to the above configuration, it is possible to drive at least one of the multiple double-sided electrodes 50, 50a, 50b separately or independently from another multiple double-sided electrode 50, 50a, 50b, which provides a multi-channel configuration. Therefore, it is possible to provide a variety of circuits.

The semiconductor apparatus may be configured such that the insulation trench 30 penetrates the semiconductor substrate 10 from the first surface 10a to the second surface 10b. According to the above configuration, it is possible to separate and insulate the multiple double-sided electrode elements 50, 50a, 50b from each other, regardless of providing the common electrode 21.

When the second electrodes 21, 21a, 21b are integrated into the common electrode 21, the semiconductor apparatus may be configured such that: the at least two double-sided electrode elements 50, 50a, 50b sharing the common electrode 21 are insulated and separated from each other by the insulation trench 30; and the insulation trench 30 extends from the first surface 10a of the semiconductor substrate 10 to an end of the PN column region 13, the end being located on the second surface 10b side of the semiconductor substrate 10. According to the above configuration, since it is possible to shallow a depth of the insulation trench 30, manufacturing becomes easy.

The semiconductor apparatus may be configured such that: the multiple elements 50, 50a, 50b, 51, 51a, 51b further includes at least one single-sided electrode element 51, 51a, 51b; each single-sided electrode element 51, 51a, 51b has a pair of electrode 25, 26, which are a third electrode 25 and a fourth electrode 26; and both of the third electrode 25 and the fourth electrode 26 are located on one of the first surface 10a and the second surface 10b of the semiconductor substrate 10. According to the above configuration, since the double-sided electrode element 50, 50a, 50b and the single-sided electrode element 51, 51a, 51b are integrated into the same semiconductor substrate 10, it is possible to provide a semiconductor apparatus that functions as a hybrid IC or a compound IC including an integrated control circuit or an integrated protection circuit. The double-sided electrode element 50, 50a, 50b may be a bipolar transistor element, a lateral type MOS transistor element, a complementary MOS transistor element, a diode, a capacitor, a resistor, or the like.

The semiconductor apparatus may be configured such that: the insulation trench 30 has a trench wall; and the insulation trench 30 has one of an insulator that fills in the trench wall and a cavity located inside the trench wall.

The semiconductor apparatus may be configured such that: the insulation trench 30 has a trench wall, an trench insulation film 30b located on the trench wall, and a conductor 30c; and the insulation trench 30 is filled with a conductor 30c that is located inside the trench insulation film 30b. According to the above configuration, since multiple (e.g., two) parasitic capacitors each utilizing the trench insulation film 30b as a dielectric are connected in series between adjacent elements, a capacitance or total capacitance of the multiple parasitic capacitors is larger than that in a case of one parasitic capacitor. Therefore, it is possible to reduce a displacement current that flows in response to a voltage fluctuation. Further, when a transient signal propagates between the parasitic capacitors, the transient signal loses energy due to a resistance. Therefore, it is possible to efficiently reduce or restrict propagation of the transient signal (e.g., surge).

The semiconductor apparatus may be configured such that an electric potential of the conductor 30c is fixed to a predetermined value. According to the above configuration, it is possible to discharge the electrical charges stored in the parasitic capacitors into a member having an electric potential substantially equal to that of the conductor 30c. As a result, it is possible to more efficiently restrict the propagation of the transient signal such as surge or the like.

The semiconductor apparatus may be configured such that the conductor 30c is electrically connected with the second electrode 21, 21a, 21b, so that an electric potential of the conductor 30c is substantially equal to that of the second electrode 21, 21a, 21b. According to the above configuration, it is possible to increase a breakdown voltage of the double-sided electrode element 50, 50a, 50b compared to a case where, for example, the conductor 30c and the first electrode 18a, 18b are configured to have a substantially same electric potential, as shown in the above-described simulations performed by the inventors. Further, since an electrode of an element, a line and the like may be concentrated on the first surface 10a side of the semiconductor substrate 10, the use of the second surface 10b side of the semiconductor substrate 10 simplifies a configuration for the conductor 30c to have a given electric potential compared to the use of the first surface 10a side.

The semiconductor apparatus may further include a line element 24 that is located on the first surface 10a of the semiconductor substrate 10. The line element 24 may be electrically connected with the conductor 30c, so that an electric potential of the second electrode 21, 21a, 21b can be monitored through the line element 24 and the conductor 30c. According to the above configuration, measurement of an electric potential of the second electrode 21, 21a, 21b can be made at the first surface 10a side of the semiconductor substrate 10.

Alternatively, the semiconductor apparatus may further includes a line element 24 that is located on the first surface 10a of the semiconductor substrate 10, and that is electrically connected with the conductor 30c, wherein: the multiple elements 50, 50a, 50b, 51, 51a, 51b includes a first element provided differently from the at least two double-sided electrode elements 50, 50a, 50b; and the conductor 30c is electrically connected with the first element through the line element 24. According to the above configuration, it is possible to improve a function of a circuit that includes the multiple elements 50, 50a, 50b, 51, 51a, 51b located in the semiconductor substrate 10. The function is, for example, feedback control based on the electric potential of the second electrode 21, 21a, 21b.

The semiconductor apparatus may be configured such that; the insulation trench 30 is a first insulation trench 30; the semiconductor apparatus further includes a second insulation trench 30; a portion of the second insulation trench 30 and a portion of the first insulation trench 30 are located between adjacent element forming regions 11, 12, 27, 28; the portion of the second insulation trench 30 and the portion of the first insulation trench 30 define an inter-element region 33 therebetween; the inter-element region 33 is located between the adjacent element forming regions 11, 12, 27, 28. According to the above configuration, since at least two parasitic capacitors each utilizing the trench insulation film 30b as a dielectric are connected in series between the adjacent elements, a capacitance or total capacitance of the multiple parasitic capacitors is larger than that in a case of one parasitic capacitor. Therefore, it is possible reduce a displacement current that flows in response to a voltage fluctuation. Further, when a transient signal propagates between the parasitic capacitors, the transient signal loses energy due to a resistance. Therefore, it is possible to efficiently reduce or restrict propagation of the transient signal (e.g., surge).

The semiconductor apparatus may be configured such that the inter-element region 33 has the PN column region 13 having the above described configuration. According to the above configuration, parasitic capacitors utilizing depletion layers as a dielectric is provided between the elements. Therefore, it is possible to more efficiently reduce or restrict propagation of the transient signal (e.g., surge).

The semiconductor apparatus may be configured such that an electric potential of the inter-element region 33 is fixed to a predetermined value. According to the above configuration, it is possible to discharge the electrical charges stored in the parasitic capacitors into a member having an electric potential substantially equal to that of the inter-element region 33. As a result, it is possible to more efficiently restrict the propagation of the transient signal such as surge or the like.

The semiconductor apparatus may be configured such that the inter-element region 33 is electrically connected with the second electrode 21, 21a, 21b. That is, an electric potential of the inter-element region 33 is substantially equal to the second electrode 21, 21a, 21b. Since an electrode of an element, a line and the like may be concentrated on the first surface 10a side of the semiconductor substrate 10, the use of the second surface 10b side of the semiconductor substrate 10 simplifies a configuration for the inter-element region to have a given electric potential compared to the use of first surface 10a side.

The semiconductor apparatus may be configured such that: the insulation trench 30 having the above described configuration is a first insulation trench 30; the semiconductor apparatus further includes a second insulation trench 30; each of the first insulation trench 30 and the second insulation trench 30 surrounds at least one of the multiple element forming regions 11, 12, 27, 28. According to the above configuration, it is possible to more efficiently restrict propagation of the transient signal (e.g., surge) through not only a region 33 between the elements but also a periphery region.

According to a second aspect of the exemplary embodiments, a method for manufacturing a semiconductor apparatus is provided. The method includes preparing a semiconductor substrate 10c that has a first surface 10a and a second surface 10b opposite to each other. The semiconductor apparatus 10c includes a PN column region 13 having multiple P conductivity type semiconductor parts 14 and multiple N conductivity type semiconductor parts 15. The multiple P conductivity type semiconductor parts 14 and the multiple N conductivity type semiconductor parts 15 are alternately and adjacently arranged to each other in a direction perpendicular to a thickness direction of the semiconductor substrate 10c. The method further includes forming an insulation trench 30a on the semiconductor substrate 10c from a first surface 10a side of the semiconductor substrate 10c, so that the insulation trench 30a has an open end on the first surface 10a side and a bottom in the semiconductor substrate 10c. The insulation trench 30a defines multiple element forming regions 11, 12. The insulation trench 30a separates and insulates the multiple element forming regions 11, 12 from each other. The insulation trench 30a is formed so that each element forming region has the multiple P conductivity type semiconductor parts 14 and the multiple N conductivity type semiconductor parts 15. The method further includes forming parts of a double-sided electrode element 50, 50a, 50b on the first surface 10a side of each element forming region 11, 12 of the semiconductor substrate 10c. The parts of the double-sided electrode element 50, 50a, 50b include a first electrode 18a, 18b. The method further includes: after the forming of the insulation trench 30a, and after the forming of the parts of the double-sided electrode element 50, 50a, 50b on the first surface 10a side, thinning the semiconductor substrate 10c by removing a second surface 10b potion of the semiconductor substrate 10c, so that the insulation trench 30a is exposed from a second surface 10b side of the semiconductor substrate 10c. The method further includes: after the thinning of the semiconductor substrate 10c, forming other parts of the double-sided electrode element 50, 50a, 50b on the second surface 10b side of each element forming region 11, 12. The other parts include a second electrode 21, 21a, 21b opposed to the first electrode 18a, 18b. The double-sided electrode element 50, 50a, 50b is formed so that a current flows between the first electrode 18a, 18b and the second electrode 21, 21a, 21b.

According to the above method, the above-described semiconductor apparatus can be manufactured, for example, through: forming an insulation trench 30, 30c being in a not-complete penetrating state from a first surface 10a side of a semiconductor substrate 10, 10c; and thinning the semiconductor substrate 10, 10c from a second surface 10b side, so that the insulation trench 30, 30a fully penetrates the semiconductor substrate 10, 10c. Advantages of the semiconductor apparatus manufactured through the above method are substantially similar to those of the above-described semiconductor apparatus.

The above method may be such that: the forming of the insulation trench 30a includes (i) forming an trench insulation film 30b on a trench wall of the insulation trench 30a so that a cavity is left inside the trench wall, and (ii) depositing a conductive material in the cavity, so that the insulation trench 30a is filled with a conductor 30c inside the trench insulation film 30b, wherein the conductor 30c is made of the conductivity maternal; the thinning of the semiconductor substrate 10c is performed until the conductor 30c is exposed; and the forming of the other parts of the double-sided electrode element 50, 50a, 50b on the second surface 10b side includes electrically-connecting the conductor 30c and the second electrode 21, 21a, 21b. According to the above method, it is possible to provide a semiconductor apparatus having a conductor 30c that is located inside a trench wall of the insulation trench 30, 30a, and that has an electric potential substantially equal to that of the second electrode 21, 21a, 21b.

According to a third aspect of the exemplary embodiments, a method for manufacturing a semiconductor apparatus is provided. The method includes preparing a semiconductor substrate 10c that includes a first surface 10a and a second surface 10b opposite to each other. The semiconductor substrate 10c further includes a PN column region 13 having multiple P conductivity type semiconductor parts 14 and multiple N conductivity type semiconductor parts 15. The multiple P conductivity type semiconductor parts 14 and the multiple N conductivity type semiconductor parts 15 are alternately and adjacently arranged to each other in a direction perpendicular to a thickness direction of the semiconductor substrate 10c. The semiconductor substrate 10c has multiple element forming regions 11, 12. The method further includes forming parts of a double-sided electrode element 50, 50a, 50b on a first surface 10a side of each element forming region 11, 12 of the semiconductor substrate 10c.

The parts of the double-sided electrode element 50, 50a, 50b include a first electrode 18a, 18b. The method further includes forming a first surface 10a side insulation film 31 on the first surface 10a side of the semiconductor substrate 10c. The method further includes: after the forming of the parts of the double-sided electrode element 50, 50a, 50b on the first surface 10a side, and after the forming of the first surface 10a side insulation film 31, forming an insulation trench 30a from a second surface 10b side of the semiconductor substrate 10c, so that the insulation trench 30a reach the first surface 10a side insulation film 31. The insulation trench 30a separates and insulates the multiple element forming regions 11, 12 from each other. The insulation trench 30a surrounds each of the multiple element forming regions 11, 12. The insulation trench 30a is formed so that each element forming region 11, 12 includes the multiple P conductivity type semiconductor parts 14 and the multiple N conductivity type semiconductor parts 15. The method further includes: after the forming of the parts of the double-sided electrode element 50, 50a, 50b on the first surface 10a side, forming other parts of the double-sided electrode element 50, 50a, 50b on the second surface 10b side of each element forming region 11, 12 of the semiconductor substrate 10c. The other parts include a second electrode 21, 21a, 21b opposed to the first electrode 18a, 18b. The double-sided electrode element 50, 50a, 50b is formed so that a current flows between the first electrode 18a, 18b and the second electrode 21, 21a, 21b.

According to the above method, the above-described semiconductor apparatus can be manufactured, for example, through: forming the parts on the first surface 10a side of the semiconductor substrate 10, 10c in addition to forming the first surface 10a side insulation film 31 on the first surface 10a of the semiconductor substrate 10, 10c; and forming the insulation trench 30, 30c from the second surface 10b side of the semiconductor substrate 10, 10c by using the first surface 10a side insulation film 31 as a stopper. Advantages of the semiconductor apparatus manufactured through the above method are substantially similar to those of the above-described semiconductor apparatus.

When the above method is employed, if a trench wall penetrating the semiconductor substrate 10, 10c is formed so as to surround each of the element forming regions 11, 12, regions including the multiple element forming regions 11, 12 are connected with each other through the first surface 10a side insulation film 31 that is formed on the first surface 10a of the semiconductor substrate 10, 10c. Therefore, it is possible to prevent the element forming region 11, 12 from dropping out.

The above method may be further include: after the forming of the parts of the double-sided electrode element 50, 50a, 50b on the first surface 10a side, thinning the semiconductor substrate 10c by removing a second surface 10b potion of the semiconductor substrate 10c before the forming of the insulation trench 30a, and before the forming of the parts of the double-sided electrode element 50, 50a, 50b on the second surface 10b side.

According to the above method, it is possible to easily perform the forming of the insulation trench 30, 30a, more specifically, to easily perform forming a trench wall, or easily perform the forming of the trench insulation film 30b and the conductor 30c in the trench wall. Further, in a case where the insulation trench 30, 30a has the insulator film in the trench, it is unnecessary to perform a process of thinning a surface where the insulation film in the trench and the semiconductor substrate 10c co-exist. Therefore, if thinning is performed by CMP, stresses due to the polishing may be concentrated on a boundary between the trench insulation film 30b and the semiconductor substrate 10, 10c. Hence, generation of cracks in semiconductor substrate 10, 10c can be prevented. Further, if the thinning is performed by etching, it is possible to prevent formation of a step that originates from a difference in etching rate between the trench insulation film 30b and the semiconductor substrate 10, 10c. That is, the second surface 10b of the semiconductor substrate 10, 10c can be homogenously thinned.

The above method may be such that: the forming of the insulation trench 30a includes (i) forming a trench insulation film 30b on a trench wall of the insulation trench 30a so that the insulation trench 30a has a cavity inside the trench wall, and then (ii) depositing a conductive material in the cavity, so that the insulation trench 30a is filled with a conductor 30c through the trench insulation film 30b, wherein the conductor 30c is made of the conductivity maternal; and the forming of the parts of the double-sided electrode element 50, 50a, 50b on the second surface 10b side includes depositing the conductive material on the second surface 10b of the semiconductor substrate 10c to form the second electrode 21, 21a, 21b made of the conductivity material. According to the above method, it is possible to provide a semiconductor apparatus with the insulation trench 30, 30a that has an electric potential substantially equal to that of the second electrode 21, 21a, 21b.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. A semiconductor apparatus comprising:
   a semiconductor substrate that has a first surface and a second surface opposite to each other, and that has a plurality of element forming regions;
   an insulation trench that surrounds each of the plurality of element forming regions, and that insulates and separates the plurality of element forming regions from each other; and
   a plurality of elements that is respectively located in the plurality of element forming regions, wherein the plurality of elements includes at least two double-sided electrode elements, wherein each double-sided electrode element includes:
   a first electrode that is located on one of the first surface and the second surface of the semiconductor substrate;
   a second electrode that is located on the other of the first surface and the second surface of the semiconductor substrate, wherein the double-sided electrode element is configured so that a current flows between the first electrode and the second electrode;
   a PN column region that is located in the semiconductor substrate, and that includes a plurality of P conductivity type semiconductor parts and a plurality of N conductivity type semiconductor parts, wherein the plurality of P conductivity type semiconductor parts and the plurality of N conductivity type semiconductor parts are alternately and adjacently arranged in series with each other without an insulating film therebetween in a direction perpendicular to a thickness direction of the semiconductor substrate; and a drift region that is provided by one of: the plurality of P conductivity type semiconductor parts; and the plurality of N conductivity type semiconductor parts of the PN column region wherein the at least two double-sided electrode elements include at least one P channel type double-sided electrode element and at least one N channel type double-sided electrode element; the at least one P channel type double-sided electrode element utilizes the plurality of P conductivity type semiconductor parts as the drift region; and the at least one N channel type double-sided electrode element utilizes the plurality of N conductivity type semiconductor parts as the drift region.

2. The semiconductor apparatus according to claim 1, wherein each double-sided electrode element is a vertical type MOS transistor element.

3. The semiconductor apparatus according to claim 1, wherein:
each double-sided electrode element has a channel region;
the channel region is located in the semiconductor substrate, and is located between the PN column region and the first surface of the semiconductor substrate;
a conductivity type of the channel region of each double-sided electrode element is opposite to that of the drift region of the double-sided electrode element; and
the first electrode and the second electrode of each double-sided electrode element are respectively located on the first surface and the second surface of the semiconductor substrate.

4. The semiconductor apparatus according to claim 3, wherein:
respective second electrodes of the at least two double-sided electrode elements are integrated into a common electrode.

5. The semiconductor apparatus according to claim 3, wherein:
the first electrode of one of the double-sided electrode elements is electrically separated from the first electrode of another double-sided electrode element; and
the second electrode of the one of the double-sided electrode elements is electrically separated from the second electrode of the another double-sided electrode element.

6. The semiconductor apparatus according to claim 1, wherein:
the insulation trench penetrates the semiconductor substrate from the first surface to the second surface.

7. The semiconductor apparatus according to claim 4, wherein:
the at least two double-sided electrode elements sharing the common electrode are insulated and separated from each other by the insulation trench; and
the insulation trench extends from the first surface of the semiconductor substrate to an end of the PN column region, the end being located on the second surface side of the semiconductor substrate.

8. The semiconductor apparatus according to claim 1, wherein:
the plurality of elements further includes at least one single-sided electrode element;
each single-sided electrode element has a pair of electrode, which are a third electrode and a fourth electrode; and
both of the third electrode and the fourth electrode are located on one of the first surface and the second surface of the semiconductor substrate.

9. The semiconductor apparatus according to claim 1, wherein:
the insulation trench has a trench wall; and
the insulation trench has an one of: an insulator that fills in the trench wall; and a cavity that is located inside the trench wall.

10. The semiconductor apparatus according to claim 1, wherein:
the insulation trench has a trench wall, an trench insulation film located on the trench wall, and a conductor; and
the insulation trench is filled with the conductor that is located inside the trench insulation film.

11. The semiconductor apparatus according to claim 10 wherein:
an electric potential of the conductor is fixed to a predetermined value.

12. The semiconductor apparatus according to claim 11, wherein
the conductor is electrically connected with the second electrode.

13. The semiconductor apparatus according to claim 12, further comprising:
a line element that is located on the first surface of the semiconductor substrate, wherein:
the line element is electrically connected with the conductor, so that an electric potential of the second electrode can be monitored through the line element and the conductor.

14. The semiconductor apparatus according to claim 12, further comprising:
a line element that is located on the first surface of the semiconductor substrate, and that is electrically connected with the conductor, wherein:
the plurality of elements includes a first element provided differently from the at least two double-sided electrode elements; and
the conductor is electrically connected with the first element through the line element.

15. The semiconductor apparatus according to claim 1, wherein the insulation trench according to claim 1 is a first insulation trench, the semiconductor apparatus further comprising:
a second insulation trench, wherein:
a portion of the second insulation trench and a portion of the first insulation trench are located between adjacent element forming regions;
the portion of the second insulation trench and the portion of the first insulation trench define an inter-element region therebetween; and
the inter-element region is located between the adjacent element forming regions.

16. The semiconductor apparatus according to claim 15, wherein
the inter-element region has a PN column region, a configuration of which is substantially similar to that of each double-sided electrode element.

17. The semiconductor apparatus according to claim 15, wherein
an electric potential of the inter-element region is fixed to a predetermined value.

18. The semiconductor apparatus according to claim 17, wherein
the inter-element region is electrically connected with the second electrode.

19. The semiconductor apparatus according to claim 1, wherein the insulation trench according to claim 1 is a first insulation trench, the semiconductor apparatus further comprising:
a second insulation trench, wherein:
each of the first insulation trench and the second insulation trench surrounds at least one of the element-forming regions.

* * * * *